United States Patent
Murphy et al.

(10) Patent No.: US 12,124,772 B2
(45) Date of Patent: *Oct. 22, 2024

(54) METHODS AND APPARATUS FOR ARTIFICIAL INTELLIGENCE CONVERSION OF A TWO-DIMENSIONAL REFERENCE INTO A TAKEOFF

(71) Applicant: Togal.AI Inc., Miami, FL (US)

(72) Inventors: Patrick E. Murphy, Miami, FL (US); Johnny Maghzal, Miami, FL (US)

(73) Assignee: Togal.AI Inc., Miami, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/967,047

(22) Filed: Oct. 17, 2022

(65) Prior Publication Data
US 2023/0325544 A1    Oct. 12, 2023

Related U.S. Application Data

(63) Continuation of application No. 17/515,774, filed on Nov. 1, 2021, now Pat. No. 11,475,174.

(60) Provisional application No. 63/231,595, filed on Aug. 10, 2021, provisional application No. 63/158,702, filed on Mar. 9, 2021, provisional application No.
(Continued)

(51) Int. Cl.
*G06F 30/12* (2020.01)
*G06F 30/13* (2020.01)
*G06T 11/20* (2006.01)

(52) U.S. Cl.
CPC .............. *G06F 30/12* (2020.01); *G06F 30/13* (2020.01); *G06T 11/203* (2013.01)

(58) Field of Classification Search
None
See application file for complete search history.

(56) References Cited

U.S. PATENT DOCUMENTS

| 4,642,780 A | 2/1987 | Thomson |
| 6,756,998 B1 | 6/2004 | Bilger |

(Continued)

FOREIGN PATENT DOCUMENTS

| CN | 105023201 A | 11/2015 |
| EP | 3550493 A1 | 10/2019 |

(Continued)

OTHER PUBLICATIONS

Risto Miikkulainen et al., Evolving Deep Neural Networks, Sentient Technologies, Inc., The University of Texas at Austin, arXiv:1703.00548v2 [cs.NE], Mar. 4, 2017.

(Continued)

*Primary Examiner* — Matthew Ell
*Assistant Examiner* — Conrad R Pack
(74) *Attorney, Agent, or Firm* — Tracnik Law PLLC; Joseph P. Kincart

(57) ABSTRACT

Methods and apparatus for processing two-dimensional references using artificial intelligence to generate items in a construction takeoff. A two-dimensional reference, such as an architectural floor plan is provided as input to a controller operative to be an artificial intelligence engine (AI engine). The AI engine generates a user interactive interface and quantities of items, such as net floor space of a room or a region, and dominance rankings, which may be used to generate the construction takeoff.

19 Claims, 23 Drawing Sheets

Related U.S. Application Data

63/158,727, filed on Mar. 9, 2021, provisional application No. 63/158,744, filed on Mar. 9, 2021.

(56) References Cited

U.S. PATENT DOCUMENTS

| | | | |
|---|---|---|---|
| 9,898,912 | B1 | 2/2018 | Jordan et al. |
| 11,321,500 | B1 | 5/2022 | Oaks et al. |
| 2002/0013704 | A1 | 1/2002 | Finney |
| 2005/0038636 | A1 | 2/2005 | Wakelam et al. |
| 2006/0136179 | A1 | 6/2006 | Sit |
| 2007/0009155 | A1 | 1/2007 | Potts et al. |
| 2007/0237395 | A1 | 10/2007 | Spencer et al. |
| 2008/0126022 | A1* | 5/2008 | Hoguet ............ G06F 30/13 703/1 |
| 2009/0024970 | A1 | 1/2009 | Saito et al. |
| 2010/0066559 | A1* | 3/2010 | Judelson ............ G08B 25/14 358/448 |
| 2011/0063670 | A1 | 3/2011 | Ito |
| 2011/0213588 | A1 | 9/2011 | Lin et al. |
| 2012/0109596 | A1* | 5/2012 | Gladstone ........ G06Q 30/0283 703/1 |
| 2012/0253751 | A1 | 10/2012 | Malka et al. |
| 2012/0276517 | A1 | 11/2012 | Banaszuk et al. |
| 2013/0120426 | A1 | 5/2013 | DiVerdi et al. |
| 2013/0211790 | A1 | 8/2013 | Loveland et al. |
| 2013/0218780 | A1 | 8/2013 | Buzz |
| 2014/0244338 | A1* | 8/2014 | Buzz ............ G06Q 10/06 705/7.23 |
| 2015/0131871 | A1 | 5/2015 | Chen et al. |
| 2015/0227644 | A1* | 8/2015 | Schultz ............ G01C 15/002 703/1 |
| 2015/0260541 | A1 | 9/2015 | Smith |
| 2017/0147717 | A1 | 5/2017 | Chen et al. |
| 2017/0316115 | A1* | 11/2017 | Lewis ............ G06F 30/13 |
| 2018/0032645 | A1 | 2/2018 | Wright et al. |
| 2018/0121571 | A1 | 5/2018 | Tiwari et al. |
| 2018/0218301 | A1 | 8/2018 | Shike et al. |
| 2019/0022811 | A1 | 1/2019 | Roettgen |
| 2019/0108603 | A1 | 4/2019 | Waslander et al. |
| 2019/0130233 | A1 | 5/2019 | Stenger et al. |
| 2019/0310653 | A1 | 10/2019 | Lee et al. |
| 2020/0134745 | A1 | 4/2020 | McLinden et al. |
| 2020/0242849 | A1 | 7/2020 | Cini |
| 2020/0302630 | A1 | 9/2020 | Spader et al. |
| 2021/0019453 | A1 | 1/2021 | Yang et al. |
| 2021/0073433 | A1* | 3/2021 | Austern ............ G06F 30/13 |
| 2021/0103687 | A1 | 4/2021 | Harris et al. |
| 2021/0150088 | A1 | 5/2021 | Gallo et al. |
| 2021/0165929 | A1 | 6/2021 | Ayalon |

FOREIGN PATENT DOCUMENTS

| | | |
|---|---|---|
| WO | 2016015431 A1 | 2/2016 |
| WO | 2020031009 A1 | 2/2020 |
| WO | 2020220068 A1 | 11/2020 |

OTHER PUBLICATIONS

ISR/WO issued Aug. 15, 2023 in correlated PCT/US2023/025631 by the International Bureau.

Bigda, Kristen, Basics of Means of Egress Arrangement, National Fire Protection Association, available at https://www.nfpa.org/news-blogs-and-articles/blogs/2021/10/15/basics-of-means-of-egress-arrangement (Oct. 15, 2021).

Kannala, Matti Escape Route Analysis Based on Building Information Models: Design and Implementation, Department of Computer Science and Engineering, Helsinki University of Technology, Helsinki Finland, (Dec. 7, 2005). http://mattikannala.fi/projects/masters-thesis/matti_kannala_mt_final.pdf.

CCPIA, Commercial Property Safety Requirements: Maximum Occupancy, available at https://ccpia.org/occupancy-load-signs/ (accessed Jun. 20, 2020).

* cited by examiner

| | 322 | 323 | 324 | 325 | 326 | 327 |
|---|---|---|---|---|---|---|
| AREA TYPE | PRIVATE OFFICE | GENERAL OFFICE SPACE | PUBLIC CONF. ROOM | PRIVATE CONF. ROOM | PRIVATE WATER CLOSET | PUBLIC WATER CLOSET |
| 322 PRIVATE OFFICE | 50/50 | 50/40 | 40/60 | 50/50 | 50/50 | 40/60 |
| 323 GENERAL OFFICE SPACE | | | | | | |
| 324 PUBLIC CONF. ROOM | | | | | | |
| 325 PRIVATE CONF. ROOM | | | | | | |
| 326 PRIVATE WATER CLOSET | | | | | | |
| 327 PUBLIC WATER CLOSET | | | | | | |

FIG. 3D

TABLE A

| AREA TYPE MAPPING | | |
|---|---|---|
| CASUAL NAME | CLASS NAME | # |
| NONE | none | 0 |
| RESIDENTIAL | residential | 1 |
| HOTEL | hotel | 1 |
| RETAIL | office | 1 |
| OFFICE | amenity | 1 |
| AMENITIES | foh | 1 |
| FOH | bohAc | 1 |
| BOH AC | bohNonAc | 1 |
| PARKING | parking | 1 |
| STAIRS | stair | 1 |
| PUBLIC TERRACES | publicTerrace | 1 |
| PRIVATE BALCONIES | privateBalcony | 1 |
| NON-ACCESSIBLE | nonAccessible | 1 |

413 — NONE
411 — OFFICE
412 — STAIRS

| 414 | UNIT (415) | WORK TYPE (416) | WORK QTY. (417) | WORK HRS. (418) | ADDTL. COST (419) | EXPEDITE COST (420) | LINE ITEM COST (421) |
|---|---|---|---|---|---|---|---|
| ITEM ONE | A | ELEC. | 1 | 650 | $2000 | $5500 | $7750 |
| ITEM TWO | | | | | | | |
| ITEM THREE | | | | | | | |
| ITEM FOUR | | | | | | | |
| TOTAL 422 | | | | | | | |

TABLE B

FIG. 4B

METHODS AND APPARATUS FOR ARTIFICIAL INTELLIGENCE CONVERSION OF A TWO- DIMENSIONAL REFERENCE INTO A TAKEOFF

CROSS REFERENCE TO RELATED APPLICATIONS

This application claims priority to U.S. Nonprovisional Application No. 17/515,774, filed Nov. 1, 2021, entitled METHODS AND APPARATUS FOR ARTIFICIAL INTELLIGENCE CONVERSION OF A TWO-DIMENSIONAL REFERENCE INTO A ACTIONABLE INTERFACE, which claims priority to U.S. Provisional Application No. 63/231,595, filed Aug. 10, 2021, entitled METHODS AND APPARATUS FOR PROCESSING TWO DIMENSIONAL DOCUMENTS AND BIM DOCUMENTS WITH ARTIFICIAL INTELLIGENCE; U.S. Provisional Application No. 63/158,744, filed Mar. 9, 2021, entitled METHOD AND APPARATUS FOR GENERATING IMPROVED PROJECT MANAGEMENT; U.S. Provisional application No. 63/158,702, filed Mar. 9, 2021, entitled METHOD AND APPARATUS FOR IMPROVED CONSTRUCTION ESTIMATION PROCESSES; and U.S. Provisional Application No. 63/158,702, filed Mar. 9, 2021, entitled METHODS AND APPARATUS FOR ARTIFICIAL INTELLIGENCE CONVERSION OF A TWO-DIMENSIONAL REFERENCE INTO AN ACTIONABLE INTERFACE, the entire disclosures of each of which are incorporated herein by reference.

FIELD OF THE INVENTION

The present invention relates to methods and apparatus for converting a two-dimensional reference such as a blueprint or building information modeling (BIM) design into an actionable interface.

BACKGROUND OF THE INVENTION

Industries such as the construction industry, rely upon two dimensional documents, such as blueprints or floorplans to carry out their day-to-day work. The two-dimensional document may include details of what a structure will consist of upon completion of building the structure. Typically, a document is scaled and includes some indication of the scale. Features and measurements of what is to be built are manually calculated from item the two-dimensional document and the scale. A certain margin of error that is generally assumed in interpreting the documents, and the margin of error may be subjective to each person performing a manual analysis.

It can also be useful to access data from various types of BIM and Computer Aided Drafting (CAD) design programs and to create estimates by porting dimensional and shape aspects of select spaces or portions of the designs.

However, such manual processes are incredibly time intensive and other than perhaps individual memory of skilled personnel, do not draw upon learnings from past jobs. Another concerning factor includes a trend for large portions of a skilled workforce that performs the manual calculations to retire from their professional careers. Retiring with this skilled workforce are many of the learnings on which companies rely.

SUMMARY OF THE DISCLOSURE

Accordingly, the present disclosure provides methods and apparatus for analyzing two-dimensional (2D) documents with the aid of computer processors using faster, more consistent processes that are not reliant upon a skill set of any particular worker, and which leverage memorialized learnings such that the learnings may be accessed to provide increasingly higher quality work product across a wide body of work and warehouse relevant analysis for subsequent reference, often by workers that have no knowledge of each other, no less the work undertaken by each. In this way a unified body of knowledge related to structures to be built is created and referenceable for upcoming projects.

In general, the method steps taught in the present invention include receiving as input a 2D reference (either physical or electronic) and generating one or more pixel patterns based upon analysis of the 2D reference. The pixel patterns are analyzed using computerized processing techniques to mimic the perception, learning, problem-solving, and decision-making formerly performed by human workers.

Based upon AI analysis of pixel patterns derived from the 2D references and knowledge accumulated from increasing volumes of analyzed 2D references, interactive user interfaces may be generated that allow for a user to modify dynamic 2D representations of features gleaned from the two-dimensional reference. AI processing of the pixel patterns, based upon the 2D references, may include mathematical analysis of polygons formed by joining select vectors included in the two-dimensional reference. The analysis of pixel patterns and manipulatable vector interfaces and/or polygon-based interfaces is advantageous over human processing in that AI analysis of pixel patterns, vectors and polygons is capable of leveraging knowledge gained from one or both of: a select group and learnings derived from similar previous bodies of work, whether or not a human requesting a current analysis was involved in the previous learnings.

In still another aspect, in some embodiments, enhanced interactive interfaces may include one or more of: user definable and/or editable lines; user definable and/or editable vectors; and user definable and/or editable polygons. The interactive interface may also be referenced to generate diagrams based upon the lines, vectors and polygons defined in the interactive interface. Still further, various embodiments include values for variables that are definable via the interactive interface with AI processing and human input.

According to the present invention, analysis of pixel patterns and enhanced vector diagrams and/or polygon based diagrams may include one or more of: neural network analysis, opposing (or adversarial) neural networks analysis, machine learning, deep learning, artificial-intelligence techniques (including strong AI and weak AI), forward propagation, reverse propagation and other method steps that mimic capabilities normally associated with the human mind—including learning from examples and experience, recognizing patterns and/or objects, understanding and responding to patterns in positions relative to other patterns, making decisions, solving problems. The analysis also combines these and other capabilities to perform functions the skilled labor force traditionally performed.

The methods and apparatus of the present invention are presented herein generally, by way of example, to actions, processes, and deliverables important to industries such as the construction industry, by generating improved estimation analysis documents, based on inputted, two dimensional references that include blueprints, design plans, floor plans or other construction related diagrams, however, two dimensional references may include almost any two dimensional artifact that may be converted to a pixel pattern.

Some specific embodiments of the present invention include input of a 2D representation (e.g., a blueprint, design plan floorplan or other 2D artifact) so that it may be analyzed using artificial intelligence, and used to generate improved estimation parameters in a short time period. However, unless expressly indicated in an associated claim, the present invention is not limited to analysis of 2D representations for any particular industry. The examples provided herein are illustrative in nature and show that the present invention may use controllers and/or neural networks and artificial-intelligence (AI) techniques to identify aspects of a building described by a 2D representation and specify quantities for variables used to generate a bid or other proposal for completion of a project (or some subset of a project) represented by the 2D representation. For example, aspects of a building that are identified may include one or more of: walls or other boundaries; doorways; doors; plumbing; plumbing fixtures; hardware; fasteners; wall board; flooring; a level of complexity and other variables ascertainable via analysis of the 2D representation. AI analysts provides values for variables used in estimations involved in a project bidding process or related activity.

The present invention provides for systems of one or more computers that can be configured to perform particular operations or actions by virtue of having software, firmware, hardware, or a combination of them installed on the system that in operation causes or cause the system to perform the actions. One or more computer programs can be configured to perform artificial intelligence operations or actions by virtue of including instructions that, when executed by data processing apparatus, cause the apparatus to perform the actions. One general aspect includes a method of quantifying requirements for construction of a building based upon artificial intelligence analysis of a two-dimensional reference. The method of quantifying requirements also includes receiving into a controller a two-dimensional representation of at least a portion of a building; representing the portion of a two-dimensional representation as a raster image; analyzing the raster image with an artificial intelligence engine operative on the controller to ascertain components included in the two-dimensional representation; determining a scale of the components included in the two-dimensional representation; generating a user interface including at least some of the multiple components; arranging the components in the user interface to form boundaries; generating at least one of an area of a feature based upon the formed boundaries, and a length of a feature based upon a formed boundaries; based upon one or more of the components included in the two dimensional representation, the area of a feature, and the formed boundaries, designating a quantity of an item to be included in the construction of the building; repeating step h, for multiple items to be included in the construction of the building; and aggregating the quantities of items to be included in the construction of the building. Other embodiments of this aspect include corresponding computer systems, apparatus, and computer programs recorded on one or more computer storage devices, each configured to perform the actions of the methods.

BRIEF DESCRIPTION OF THE DRAWINGS

The accompanying drawings, which are incorporated into and constitute a part of this specification, illustrate several embodiments of the present invention. Together with the description, these drawings serve to illustrate some aspects of the present invention.

FIG. 3D shows a table illustrating hierarchical relationships between area types.

FIGS. 4A-4B illustrate various aspects of dominance-based area allocation.

DETAILED DESCRIPTION

The present invention provides improved methods and apparatus for artificial intelligence-based conversion of a two reference into an interactive interface. The interactive interface is operative to generate values of variables useful for completion of a project and/or task. As described herein, a project may include construction or a building or other structure, and a portion of the project, or task, may include generation of a bid to complete the project or portion of the project. A submission of a bid to complete the project and/or subset of a project is also within the scope of the present invention.

According to the present invention, a controller operative to execute artificial intelligence (AI) processes and analyze one or more 2D representations of at least a portion of a building (or other structure) on which a bid will be submitted and provides values for variables used to generate a bid for projects to be completed based upon descriptive content included in the 2D representations.

In some embodiments, the 2D representation may include technical drawings such as blueprints, floorplans, design plans and the like. The AI analysis may include determination of boundaries and/or features indicated in the 2D representation. This boundary determination may be used to provide useful information about a building such as an area of individual rooms, a perimeter of a defined area, and the like. These parameters may in turn be useful in a variety of cost estimation elements, such as (without limitation); flooring (wood, ceramic, carpet, tile, etc.), structural (poured concrete, steel), walls (gypsum, masonry blocks, glass walls, wall base, exterior cladding), doors and frames (hollow metal, wood, glass), windows glazing, insulation, paint (ceilings and walls), acoustical ceilings, code compliance, stucco (ceilings and walls), mechanical, plumbing, and electrical aspects.

In another aspect, in some embodiments, AI analysis may include determination of architectural aspects, such as doorways, windows, angles in walls, curves in walls, plumbing fixtures, piping, wiring, electrical equipment or boxes; duct work; HVAC fixtures and/or equipment; or other component or aspect conducive to generating values of variables useful for submitting a bid for work included in a project, such as construction of a structure depicted in a to drawing comprising the 2D representation.

In the following sections, detailed descriptions of examples and methods will be given. The description of both preferred and alternative examples, though thorough, are exemplary only. It is understood that, to those skilled in the art, that various modifications and alterations may be apparent and within the scope of the present invention. Unless otherwise indicated by the language of the claims, the examples do not limit the broadness of the aspects of the underlying invention as defined by the claims.

Figure 1:
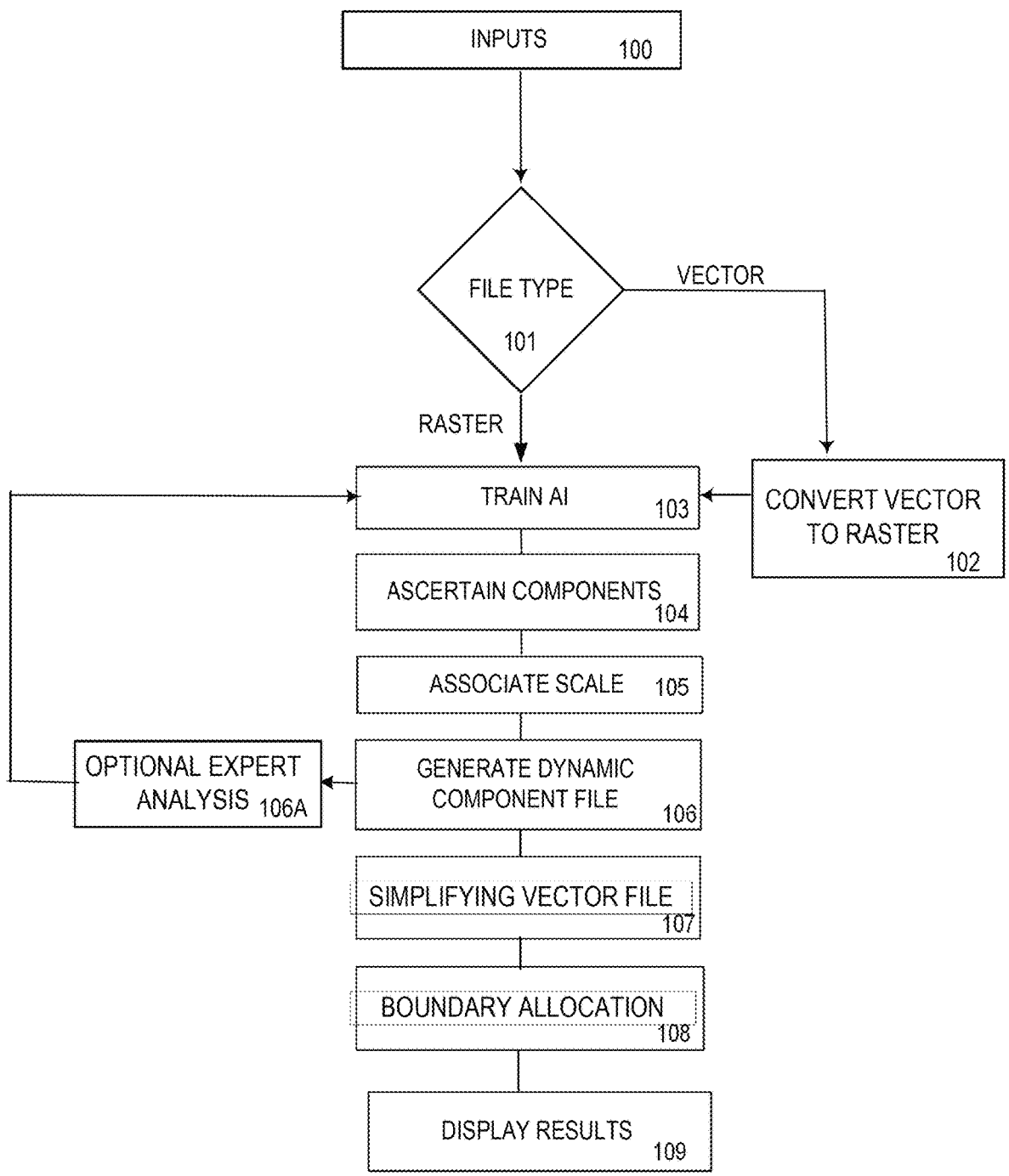
FIG. 1 illustrates method steps that may be implemented in some embodiments of the present invention.

Referring now FIG. 1, a general flow diagram showing some preferred embodiments of the present invention is illustrated. At step 100, a 2D representation, such as, by way of nonlimiting example: drawing files, architectural floor plans; technical drawings; or other two-dimensional document indicating aspects of a building; is input into a controller or other data processing system using a computing device. The 2D representation may include an item of a known size, such as, by way of non-limiting example, a scale bar that allows a user to obtain a scale of the drawing (e.g., 1"=100' etc.) or an architectural aspect of a known dimension, such as a wall or doorway of a known length.

Input of the two-dimensional reference into the controller may occur, for example, via known ways of rendering an image as a vector diagram, such as via a scan of paper-based initial drawings; upload of a vector image file (e.g., encapsulated postscript file (epf file); adobe illustrator file (ai file); or portable document file (pdf file). In other examples, a starting point for estimation may be drawing file in an electronic file containing a model output for an architectural floor plan. In still further examples, other types of images stored in electronic files such as those generated by cameras may be used as inputs for estimation.

In some embodiments, the two-dimensional reference input may be files extensions that include but are not limited to: DWG, DXF, PDF, TIFF, PNG, JPEG, GIF or other type of file based upon a set of engineering drawings. Some two-dimensional reference references may already be in a pixel format, such as, by way of non-limiting example a two-dimensional reference in a JPEG, GIF or PNG file format. The engineering drawings may be hand drawings, or they may be computer-generated drawings, such as may be created as the output of CAD files associated with software programs such as AutoDesk™, Microstation™ etc. As some architects, design films and others who generate engineering designs for buildings may be reluctant to share raw CAD files with others, the present invention provides a solution that does not require raw CAD files.

In other examples, such as for older structures, a drawing or other 2D representation may be stored in paper format or digital version or may not exist or may never have existed. The input may also be in any raster graphics image or vector image format.

The input process may occur with a user creating, scanning into, or accessing such a file containing a raster graphics image or a vector graphics image. The user may access the file on a desktop or standalone computing device or in some embodiments, via an application running on a smart device. In some embodiments, a user may operate a scanner or a smart device with a camera to create the file containing the image on the smart device.

In some embodiments, a degree of the processing as described herein may be performed on a controller, which may include a standalone computing device or a smart device. In many examples, the input file may be communicated by the smart device to a controller embodied to a remote server. In some embodiments, the remote server, which may also be a cloud server, may have significant computing resources that may be applied to AI algorithmic calculations analyzing the image.

In some embodiments, dedicated integrated circuits tailored for deep learning AI calculations. (AI chips) may be utilized within a controller or in concert with a controller. Dedicated AI chips may be located on a controller, such as a server that supports a cloud service or a local setting directly. In some embodiments, an AI chip tailored to a particular artificial intelligence calculation may be configured into a case that may be connected to a smart device in a wired or wireless manner and may perform a deep learning AI calculation. Such AI chips may be configurable to match a number of hidden levels to be connected, the manner of connection, and physical parameters that correspond to the weighting factors of the connection in the AI engine (sometimes referred to herein as an AI model). In other examples, software only embodiments of the AI engine may be run on one or more of: local computers, cloud servers, or on smart device processing environments.

At step 101, a controller may determine if a two-dimensional representation received into the controller includes a vector diagram. If file type of the received two-dimensional representation, such as an input architectural floor plan technical drawing, includes at least a portion that is not already in raster graphics image format (for example that it is in vector format), then the input architectural floor plan technical drawing may be transformed to a pixel or raster graphics image format in step 102. Vector-to-image transforming software may executed by the controller, or via a specialized processor and associated software.

In some embodiments, the controller may determine a pixel count of a resulting rasterized file. The rasterized file will be rendered suitable for a controller hosting an artificial intelligence engine ("AI engine") to process, the AI engine may function best with a particular image size or range of image size and may include steps to scale input images to a pixel count range in order to achieve a desired result. Pixel counts may also be assigned to a file to establish the scale of a drawing—for example, 100 pixels equals 10 feet. In other examples, the Controller may either to scale up small images with interleaved average values with superimposed gaussian noise as an example, or to scale down large images with pixel removal. A desired result may be detectable by one or both of the controller and a user. For example, a desired result may be a most efficient analysis, a highest quality analysis, a fastest analysis, a version suitable for transmission over an available bandwidth for processing, or other metric.

At step 103, training (and/or retraining) of the AI engine is performed. Training may include, for example manual identification of patterns in a rasterized version of an image included in a 2D representation that correspond with architectural aspects, walls, fixtures, piping, duct work, wiring or other features that may be present in the two-dimensional reference. The training may also include one or more of: identification of relative positions and/or frequencies and sizes of identified patterns in a rasterized version of the image included in the 2D representation.

In some embodiments, and in a non-limiting sense, the artificial intelligence engine may be based on a deep learning artificial neural network framework. The image processing may extract different aspects of an image included in the 2D representation that is under analysis. At a high level, the processing may perform segmentation to define the boundaries between important features. In engineering drawings these boundaries may involve, amongst other features, i.e., the presence of walls.

In some embodiments, a structure of the artificial neural network may include multiple layers including input layers and hidden layers with designed interconnections with weighting factors. For learning optimization, the input architectural floor plan technical drawings may be used for artificial intelligence, (AI) training to enhance the AI's ability to detect what is inside a boundary. A boundary is an area on a digital image that is defined by a user and tells the software what needs to be analyzed by the AI. Boundaries may also be automatically defined by a controller executing software during certain process steps, such as a user query. Using deep artificial neural networks, original architectural floor plans (along with any labeled boundaries) may be used to train AI models to make predictions about what is inside a boundary. In exemplary embodiments, the AI model may be given over ~50,000 similar architectural floor plans to improve boundary-prediction capabilities.

In some embodiments, a training database may utilize a collection of design data that may include one or more of: a combination of a vector graphic two-dimensional references such as floor plans and associated raster graphic version of the two-dimensional references; raster graphic patterns associated with features; and a determination of boundaries may be automatically or manually derived. An exemplary AI-processed two-dimensional reference that includes a floorplan 210, with boundaries 211 predicted, is shown in FIG. 2B, based on the floorplan of FIG. 2A.

Figure 2A:
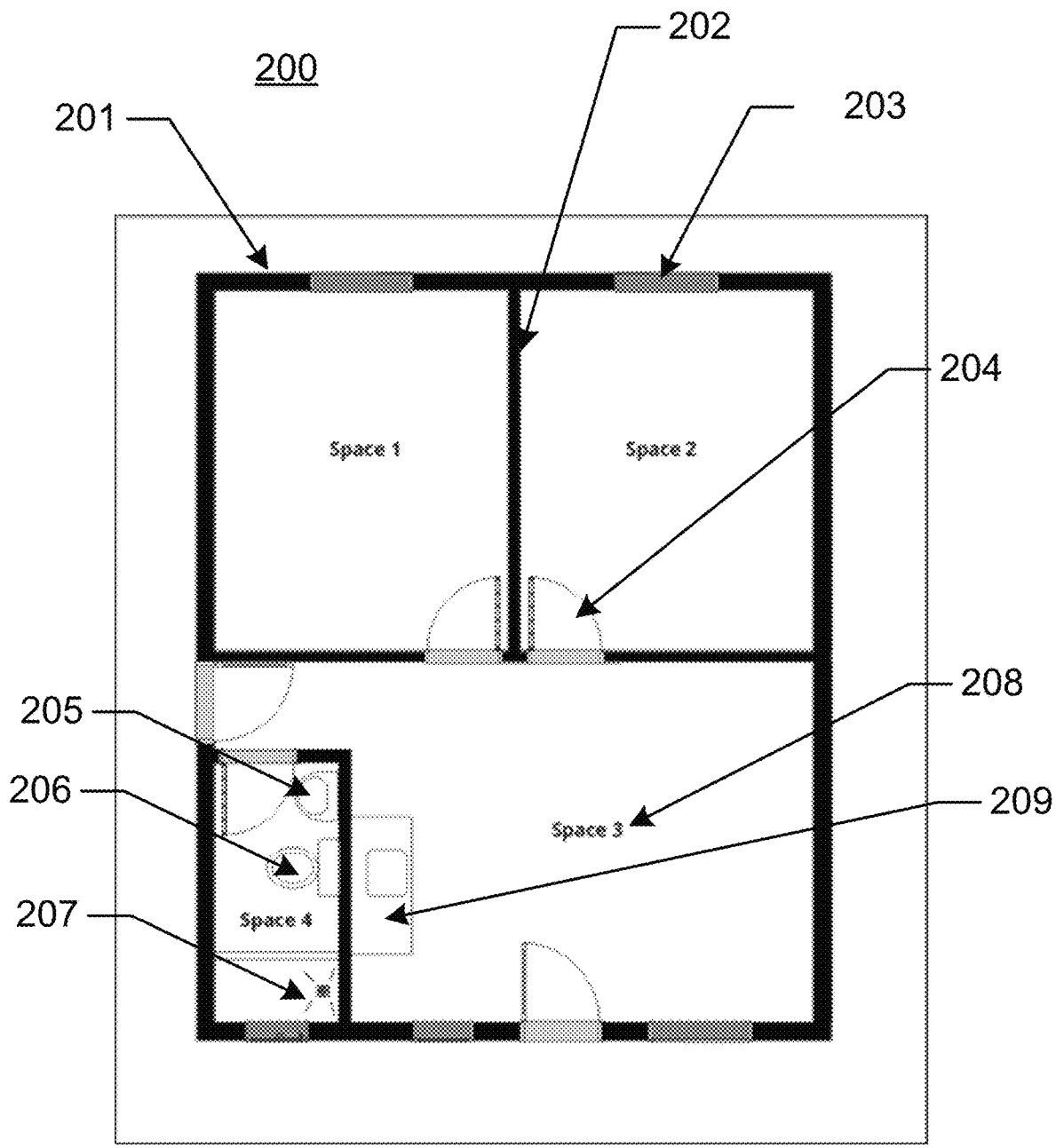
FIGS. 2A-2D show a floor plan and an AI analysis of same to assess boundaries.
Figure 2B:
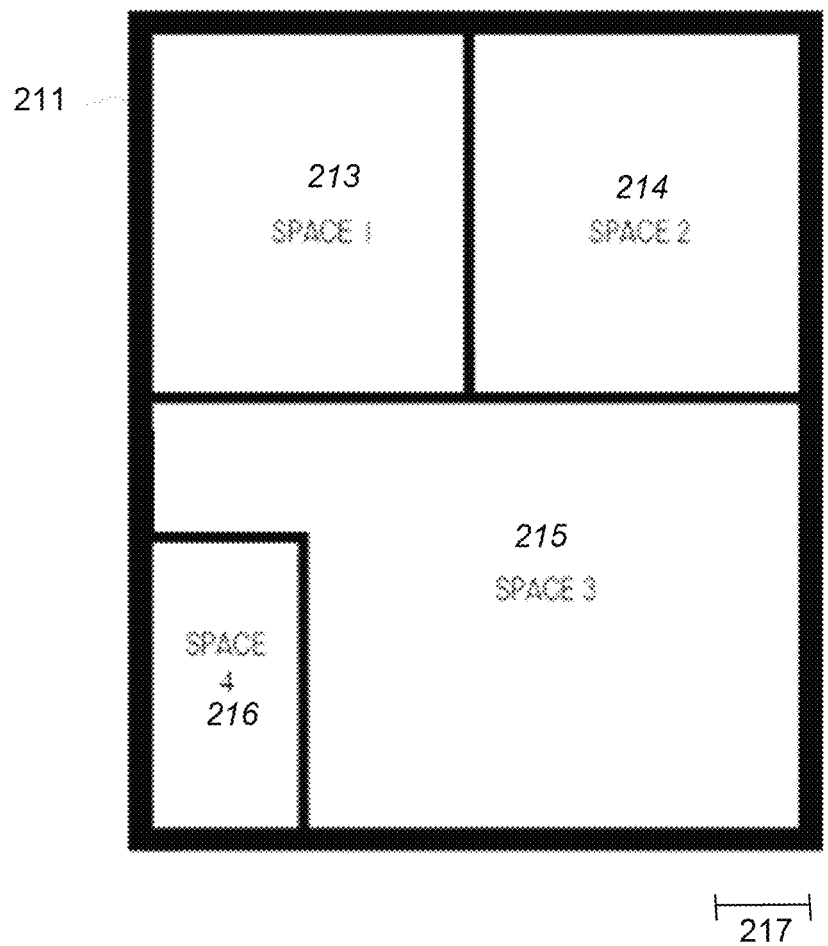

As may be observed in reference to FIG. 2A, a given two-dimensional reference may have a number of elements that an observer and/or an AI engine may classify as features 201-209 such as, for example, one or more of: exterior walls 201; interior walls 202; doorways 204; windows 203; plumbing components, such as sinks 205, toilets 206, showers 207, water closets or other water or gas related items; kitchen counters 209 and the like. The two-dimensional references may also include narrative or text 208 of various kinds throughout the two-dimensional references.

Identification and characterization of various features 201-209 and/or text may be included in the input two-dimensional references. Generation of values for variables included in generating a bid may be facilitated by splitting features into groups called 'disparate features' 201-209 and boundary definitions and generation of a numerical value associated with the features, wherein numerical values may include one or more of: a quantity of a particular type of feature; size parameters associated with features, such as the square area of a wall or floor; complexity of features (e.g., a number of angles or curves included in a perimeter of an area; a type of hardware that may be used to construct a portion of a building, a quantity of a type of hardware that may be used to construct a portion of the building; or other variable value.

A recognition step may function to replace or ignore a feature. For example, for a task goal of the result shown in FIG. 2B, features such as windows 203, and doorways, 204, may be recognized and replaced with other features consistent with exterior walls 201 or interior walls 202 (as shown in FIG. 2A). Other features may be removed, such as the text 208, the plumbing features and other internal appliances and furniture which may be shown on drawings used as input to the processing. Again, such feature recognition in other goals may be useful but for a boundary 211 goal that delineates a floorplan 210 as illustrated FIG. 2B may be a desired result.

At step 104, an AI engine may ascertain features inside boundaries such as, architectural aspects, fixtures, duct work, wiring, piping or other item included in a two-dimensional reference submitted to be analyzed. This prediction may occur, for example, via algorithmically processing an input image with a trained AI model. As a non-limiting example, the AI engine may process a raster file that is converted for output as an image file of a floorplan 210 as illustrated in FIG. 2B. This figure also shows boundary 211 as a thick line (said line may be a colored line etc.).

FIG. 2B shows boundary 211 defined around a grouping of defined spaces 213-216. Spaces are areas within a boundary (such as but not limited to rooms etc.). Upon examination of FIGS. 2 and 2B one can see how the AI predicted boundary 211 based upon an analysis of the floorplan 200. For example, training may enable and/or assist an AI engine successfully distinguish between wall features from the features such as a shower 207 or the kitchen counter 209 observed in FIG. 2A.

At step 105, a scale 217 is associated with the two-dimensional reference. In preferred embodiments, the scale 217 is based upon a portion of the two-dimensional reference dedicated for indicating a scale, such as a ruler of a specific length relative to features included in a technical drawing included in the two-dimensional reference. The software then performs a pixel count on the image and applies this scale to the bitmapped image. Alternatively, a user may input a drawing scale for a particular image, drawing or other two-dimensional reference. The drawing scale 217, may for example, be in inches: feet, centimeters, meters, or any other appropriate scale.

In some embodiments, a scale 217 may be determined by manually measuring a room, a component, or other empirical basis for assessing a scale (including the ruler discussed above). Examples therefore include a scale 217 included as a printed parameter on two-dimensional reference or obtained front dimensioned features in the drawing. For example, if it is known that a particular wall is thirty feet in length, a scale 217 may be based upon a length of the wall in a particular rendition of the two-dimensional reference and proportioned according to that length.

At step 106, a controller is operative to generate a user inter-face with dynamic components that may be manipulated by one or both of user interaction and automated processes of the user interface may include, one or more of: AI engine predicted components, user training, and AI training. In some non-limiting examples of the present invention, a generative adversarial network may include a controller with an AI engine operative to generate a user interface that includes dynamic components. In some embodiments, the generative adversarial network may be trained based on a training database for AI feature recognition processes.

An interactive user interface may include one or more of: lines, arcs, or other geometric shapes and/or polygons. The components may be dynamic in that they are further definable via user and/or machine manipulation. Components in the interactive user interface may be defined by one or more vertices. In general, a vertex is a data structure that can describe certain attributes, like the position of a point in a two-dimensional or three-dimensional space. It may also include other attributes, such as normal vectors, texture coordinates, colors, or other useful attributes.

At step 107, some embodiments may include a simplification or component refinement process that is performed by the controller. The component refinement process is functional to reduce a number of vertices generated by a transformation process executed via a controller generating the user interface and to further enhance an image included in the user interface. Improvements may include, by way of non-limiting example, one or more of: smooth an edge, define a start or end point, associate a pattern of pixels with a predefined shape corresponding with a known component or otherwise modify a shape formed by a pattern of pixels.

In addition, some embodiments that utilize the recognition step transforms features such as windows, doorways, vias and the like to other features and may be remove them and/or replace them as elements—such as line segments, vectors or polygons referenceable to other neighboring features. In a simplification step, one or more steps the AI performs (which may in some embodiments be referred to as an algorithm or a succession of algorithms) may make a determination that wall line segments, and other line segments represent a single element and then proceeds to merge them into a single element (line, vector or polygon). In some embodiments, straight lines may be specified as a default for simplified elements, but it may also be possible to simplify collections of elements into other types of primitive or complex elements including polylines, polygons, arcs, circles, ellipses, splines, and non-uniform rational basis spline (NURBS) where a single feature object with definitional parameters may supplant a collection of lines and vertices.

The interaction of two elements at a vertex may define one or more new elements. For example, an intersection of two lines at a vertex may be assessed by the AI as an angle that is formed by this combination. As many construction plan drawings are rectilinear in nature, it may be that the simplification step inside a boundary can be considered a reduction in lines and vertices and replacing them with elements.

At step 106A, In some embodiments, components presented in an interactive user interface may be analyzed by a user and refinements may be made to one or more components (e.g., size, shape and/or position of the component). In some embodiments, user modifications may also be fed back to train the AI engine.

At step 108, a controller (such as, by way of non-limiting example, a cloud server) operative as an AI engine may perform method steps to fill a space defined by elements and created by an AI-predicted boundaries that ultimately creates 'regions.' A region at this point in processing may be defined as a representation of an area on a plan file that does not include the boundaries that bound it.

Figure 2C:
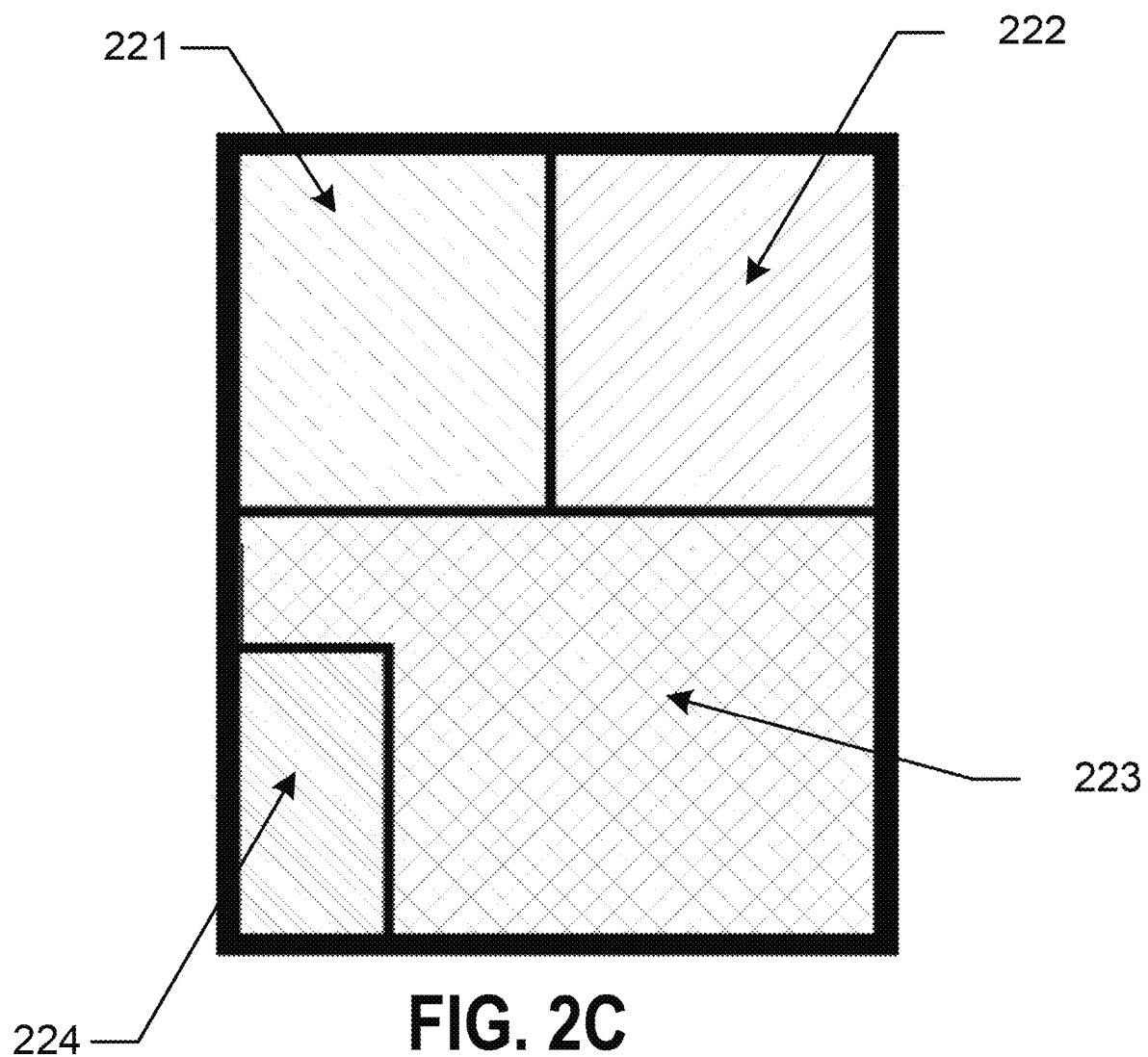

Various regions 221-224 are shown in FIG. 2C as, but not limited to, different hatch representations (regions may also be represented as various colors etc.) During training of AI engines, and in some embodiments, when a submitted design drawing includes highly-customized or unique features, an automated identification of boundaries and automated filling of space within the boundaries may not be in accordance with a particular need of a user.

During training of processes executed by a controller, such as those included in an AI engine made operative by the controller, and in some embodiments, when a submitted design drawing includes highly customized or unique features, an automated identification of boundaries and automated filling of space within the boundaries may be included in the interactive user interface may not be according to a particular need of a user. Therefore, in some embodiments of the present invention, an interactive user interface may be generated that presents a user with a display of one or more boundaries and pattern or color filled areas arranged as a reproduction of a two-dimensional reference input into the AI engine.

In some embodiments, the controller may generate a user interface that includes indications of assigned vertices and boundaries, and one or more filled areas or regions with user changeable editing features to allow the user to modify the vertices and boundaries. For example, the user interface may enable a user to transition an element such as a vertex to a different location, change an arc of a curve, move a boundary, of change an aspect of polylines, polygons, arcs, circles, ellipses, splines, NURBS or predefined subsets of the interface. The user can thereby "correct" an assignment error made by the AI engine, or simply rearrange aspects included in the interface for a particular purpose or liking.

In some embodiments, modifications and/or corrections of this type can be documented and included in training datasets of the AI model, also in processes described in later portions of the specification.

Discrete regions are regions associated with an estimation function. A region that is contained within a defined wall feature may be treated in different ways such as ignoring all area in a boundary, to counting all area in a boundary (even though regions do not include boundaries). If the AI engine counts the area, it may also make an automated decision on how to allocate the region to an adjacent region or regions that the region defines.

Figure 2D:
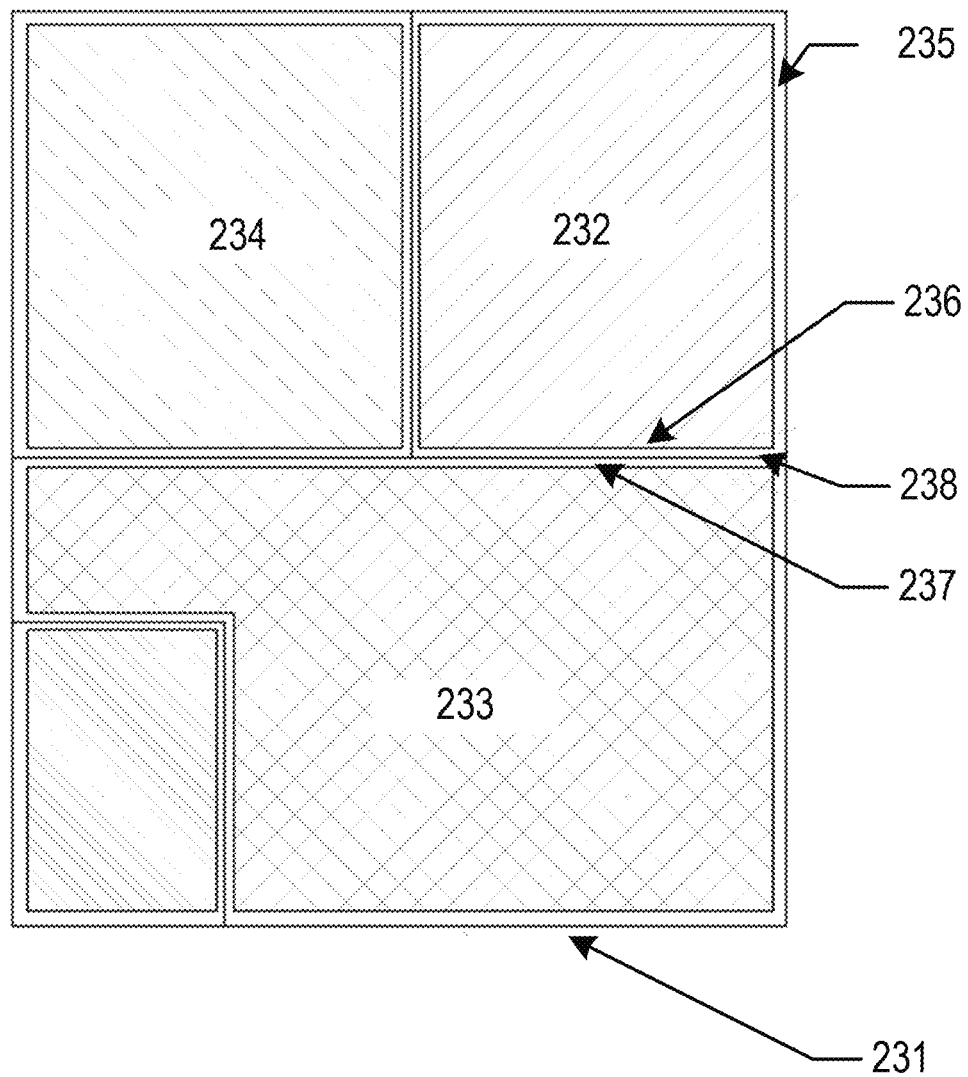

Referring to FIG. 2D, an exemplary user interface 230 illustrates a user interface floorplan model 231 with interior boundaries 236-237 between adjacent regions 233-235 with interior boundaries 236-237 that may be included in an appropriate region of a dynamic component. The AI may incorporate a hierarchy where some types of regions may be dominant over others, as described in more detail in later sections. Regions with similar dominance rank may share space, or regions with higher dominance rank may be automatically assigned to a boundary. In general, a dominance ranking schema will result in an area being allocated to the space with the higher dominance rank.

In some embodiments, an area 238 between interior boundaries 236-237 and an exterior boundary 235 may be fully assigned to an adjacent region 232-234. An area 238 between internal boundaries 236-237 may be divided between adjacent regions 232-234 to the internal boundaries 236-237. In some embodiments, an area 238 between interior boundaries 236-217 may be allocated equally, or it may be allocated based upon a dominance scheme where one type of area is parametrically assessed as dominant based upon parameters such as its area, its perimeter, its exterior perimeter, its interior perimeter, and the like.

For example, a boundary 235-237 and associated area 238 between the interior boundaries 236-237 may be allocated to a region 232-234 according to an allocation schema, such as, for example, an area dominance hierarchy, to a prioritize a kitchen over a bathroom, or a larger space over a smaller space. In some embodiments, user selectable parameters (e.g., a bathroom having parameters such as two showers, and two sinks may be more dominant over a kitchen having parameters of a single sink with no dishwasher). These parameters may be used to determine boundary and/or area dominance. A resulting computed floorplan model may include a designation of an area associated with a region as illustrated in FIG. 2D, in various embodiments, different calculated features are included a user interface model floorplan 231 such as features representing aspects of a wall, such as, for example, center lines, the extents of the walls, zones where doors open and the like, and these features may be displayed in selected circumstances.

Once boundaries have been defined a variety of calculations may be made by the system. A controller may be operative to perform method steps resulting in calculation of a variable representative of a floorplan area, which in some embodiments may be performed by integrating areas between different line features that define the regions.

Alternatively, or in addition to method steps operative to calculate a value for a variable representative of an area, a controller may be operative to generate a value for element lengths, which values may also be calculated. For example, if ceiling heights are measured, presented on drawings, or otherwise determined then volume for the room and surface area calculations for the walls may be made. There may be numerous dimensional calculations that mac be made based on the different types of model output and the user inputted calibration factors and other parameters entered by the user.

In some embodiments, a controller may be provided with two dimensional references that include a series of architectural drawings with disparate drawings representing different elevations within a structure. A three dimensional model may be effectively built based upon a sequenced stacking of the disparate drawings representing different levels of elevations. In other examples, the series of drawings may include cross sectional representation as well as elevation representation. A cross section drawing, for example, may be used to infer a common three-dimensional nature that can be attributed to the features, boundaries and areas that are extracted by the processes discussed herein. Elevation drawings may also present a structure in a three-dimensional perspective. Feature recognition processes may also be used to create three-dimensional model aspects.

Referring now again to FIG. 1, at step 109, a preliminary, or a final model output results may be displayed in an integrated fashion in relation to a replication of the two-dimensional reference (such as an input architectural floor plan or technical drawing) it may also be shown in a form that includes user modifiable elements such as but not limited to: polylines, polygons, arcs, circles, ellipses, splines, and other drawing features or combinations of lines and other elements.

Figure 3A:
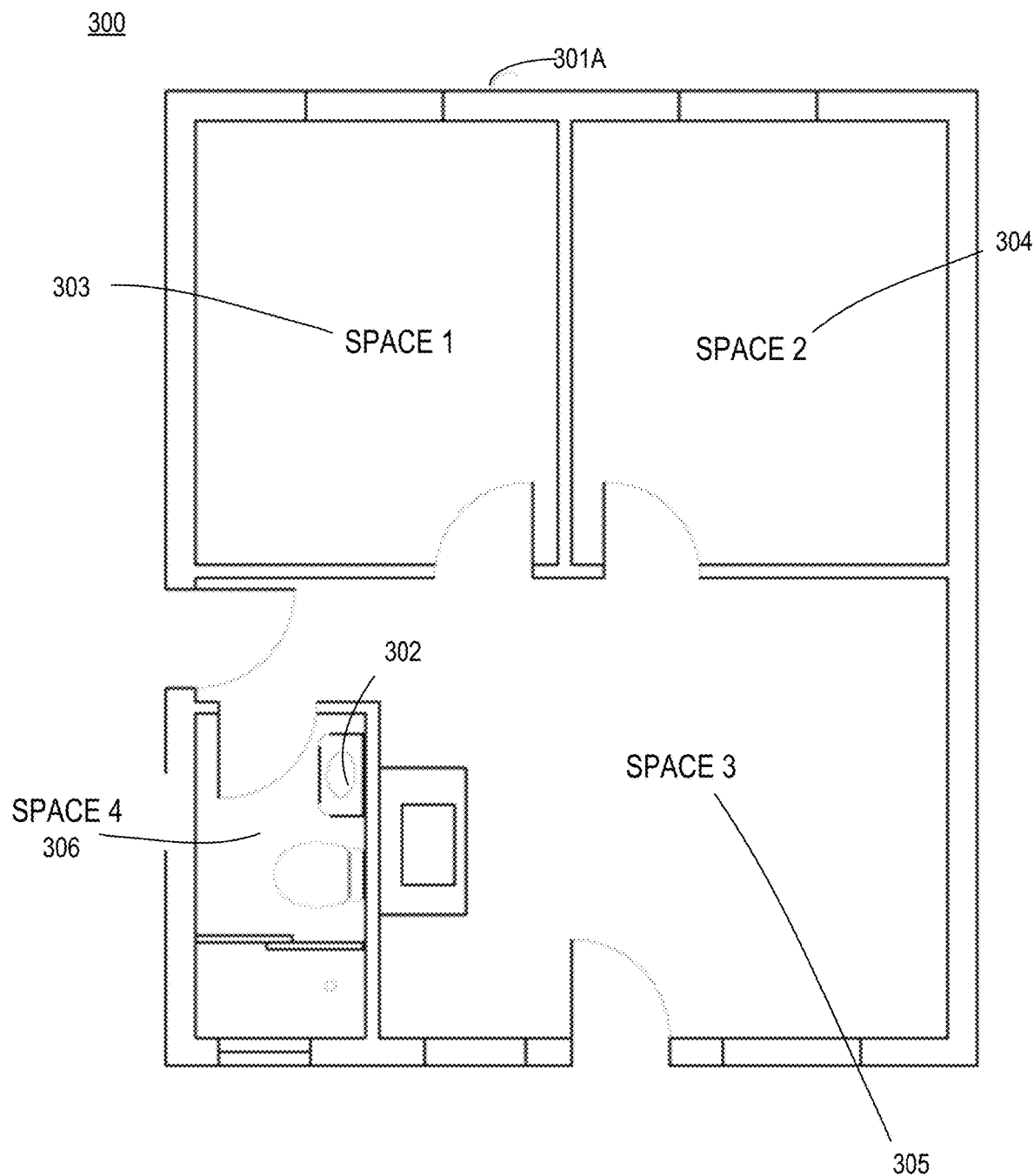
FIGS. 3A-3C show various views of the AI-analyzed boundaries overlaid on the original floorplan.
Figure 3B:
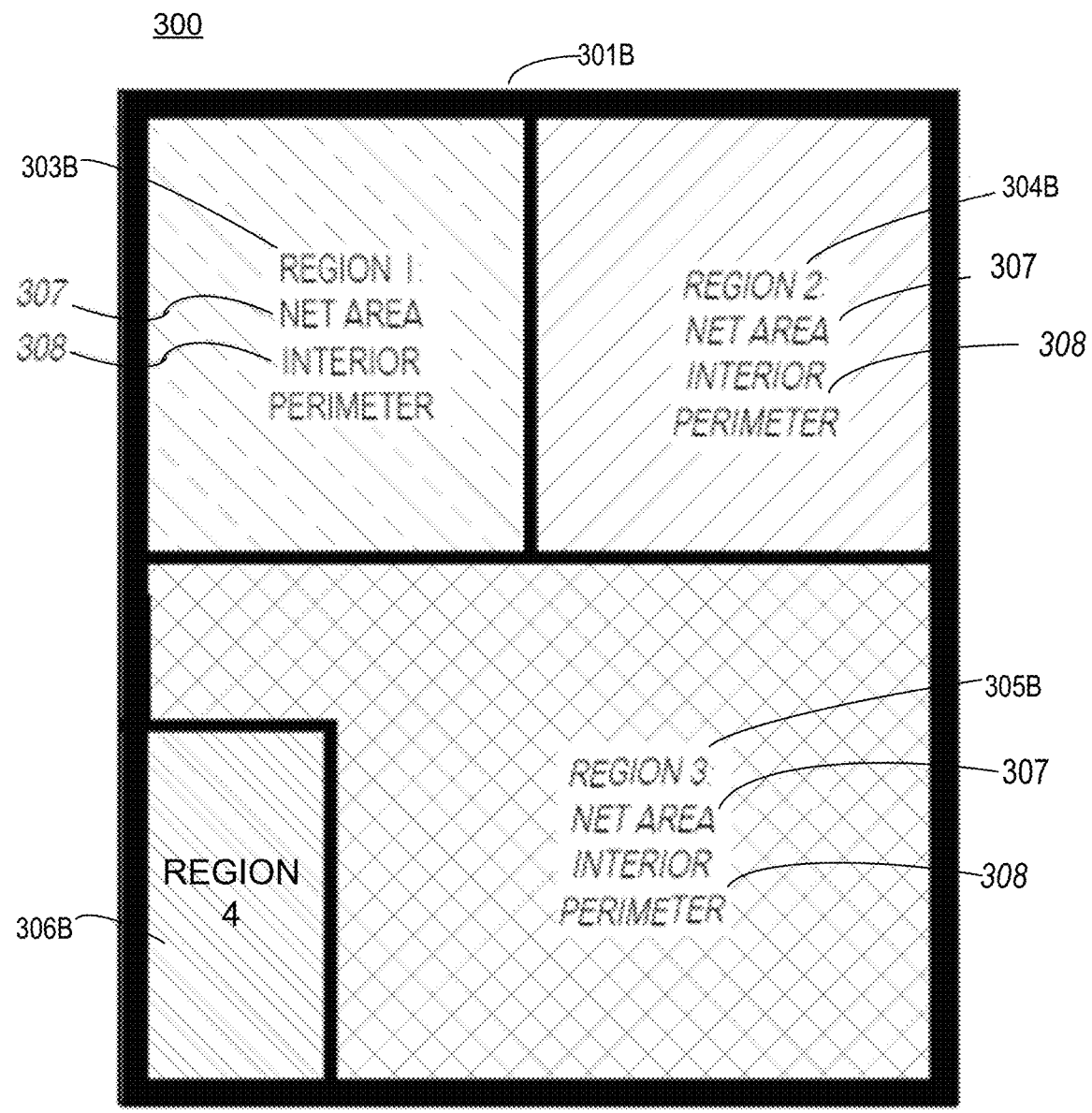
Figure 3C:
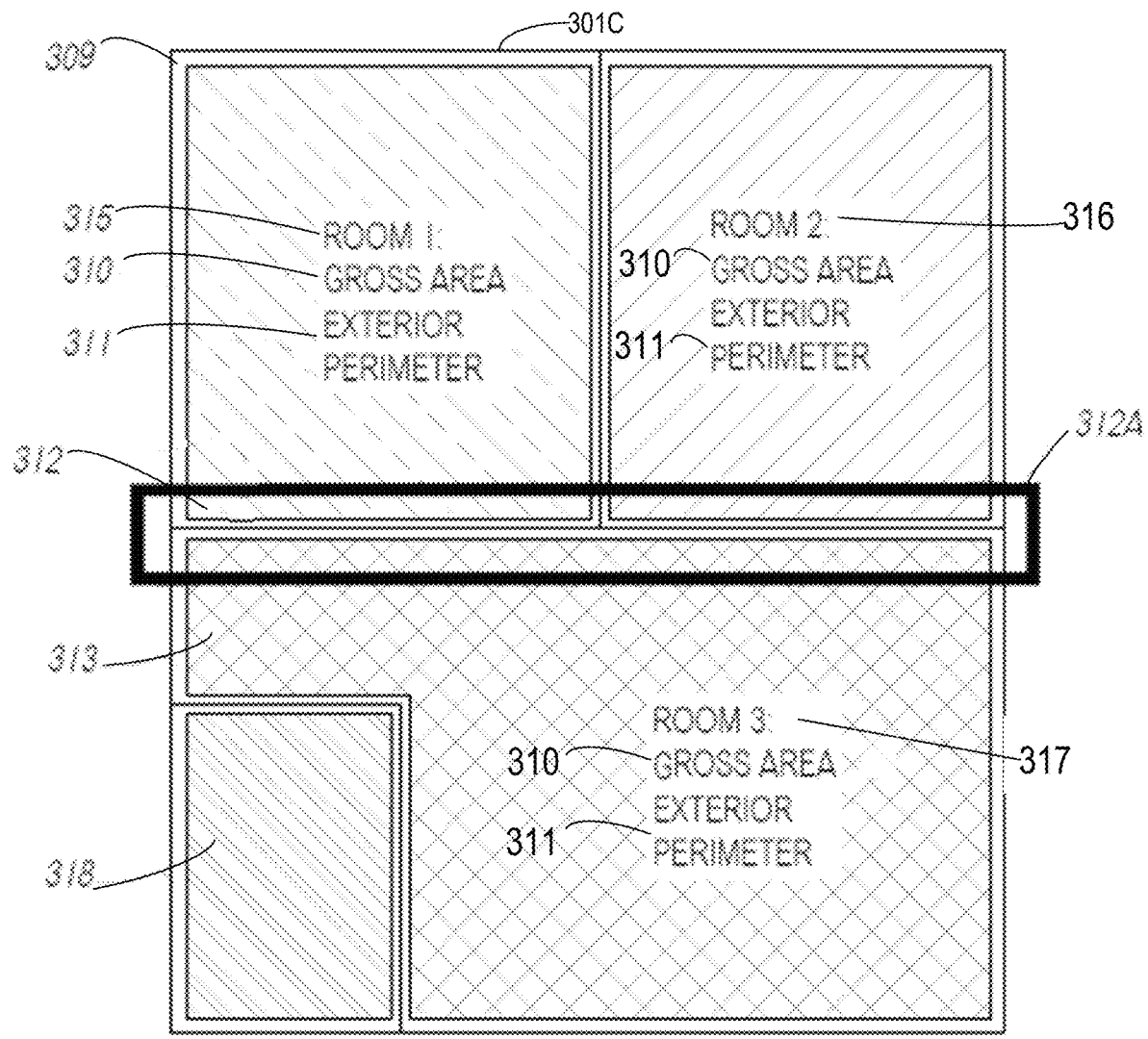

Referring now to FIGS. 3A-3C a user interface 300 may generate multiple different user views, each view has different aspects related to the two-dimensional reference drawing inputted. For example, referring now to FIG. 3A, a user interface 300 with a replication view 301 may include replication of an original floor plan represented by a two-dimensional reference, without any controller added features, vectors, lines or polygons integrated or overlaid into the floorplan. The replication view 301A includes various spaces 303-306 that are undefined in the replication view 301A, but may be defined during the processes described herein. For example, some or all of a space 303-306 may correlate to a region in a region view 301B.

The replication view 301A, may also include one or more fixtures 302. A rasterized version (or pixel version) of the fixtures 302 may be identified via an AI engine. If a pattern is present that is not identified as a fixture 302, a user may train the AI engine to recognize the pattern as a fixture of a particular type. The controller may generate a tally of multiple fixtures 302 identified in the two dimensional reference. The tally of multiple fixtures 302 may include some or all of the fixtures identified in the two dimensional reference and be used to generate an estimate for completion of a proper illustrated by, or otherwise represented by the two dimensional reference.

Referring now to FIG. 3B, in the user interface 300 a user may specify to a controller that a one of multiple views available to presented via the interface. For example, a user may designate via an interactive portion of a screen displaying the user interface 300 that a region view 301B be presented. The region view 301B may identify one or more regions 303B-306B identified via processing by a controller, such as for example via an AI engine running on the controller. The region view 301B may include information about one or more regions 303-306 delineated in the region view 301B of the user interface 300. For example, the controller may automatically generate and/or display information descriptive of one or more of: user displays, printouts or summary reports showing a net interior area 307 (e.g., a calculation of square footage available to an occupant of a region), an interior perimeter 308, a type of use a region 303B-306B will be deployed for, or a particular material to be used in the region 303B-306B. For example, Region 4 306B may be designated for use as a bathroom; and flooring and wall board associated with Region 4 may be designated as needing to be waterproof material.

Referring now to FIG. 3C in addition to FIG. 3B, a net interior area 307 may designate a value that is in contrast to a gross area 310 and exterior perimeter 311. The gross area 310 may be more useful to a proprietor charging for a leased space but, may be less useful to an occupant than a net interior area 307 and interior perimeter 308. One or more of the net interior areas 307, interior perimeter 308 gross area 310 and exterior perimeter 311 may be calculated based upon analysis by an AI engine of a two dimensional reference.

In addition, a height for a region may also be made available to the controller and/or an AI engine, then the controller may generate a net interior volume and vertical wall surface areas (interior and/or exterior).

In some embodiments, an output, such as a user interface of a computing device, smart device, tablet and the like, or a printout or other hardcopy, may illustrate one or both of: a gross area 310 and/or an exterior perimeter 311. Either output may include automatically-populated information, such as the gross area of one or more rooms (based upon the above boundary computations) or exterior perimeters of one or more rooms.

In some embodiments, the present invention calculates an area bounded within a series of polygon elements (such as, for example using mathematical principals or via pixel counting processes).

In some embodiments, in an area of a bounded by lines intersecting at vertices, the vertices may be ordered such that they proceed in a single direction such as clockwise around the bounded area. The area may then be determined by cycling through the lists of vertices and calculating an area between two points as the area of a rectangle between the lower coordinate point and an associated axis and the area of the triangle between the two points. When a path around the vertices reverses direction, the area calculations may be performed in the same manner, but the resulting area is subtracted from the total until the original vertex is reached. Other numerical methods may be employed to calculate areas, perimeters, volumes, and the like.

These views may be used in generating estimation analysis documents. Estimation analysis documents may rely on fixtures, region area, or other details. By assisting in generating net area, estimation documents may generated more accurately and quickly than is possible through human-engendered estimation parameters.

With reference now again to FIGS. 3B and 3C, regions 303B-306B defined by an AI engine may include one or more Rooms in FIG. 3B subsequently have regions assigned as "Rooms" in FIG. 3C.

Referring now to FIG. 3D, a table is illustrated containing hierarchical relationships between area types 322-327 that may be defined in and/or by an AI engine and/or via the user interface. The area types 322-327 may be associated with dominance relationship values in relation to adjacent areas. For example, a border region 312-313 (as illustrated in FIG. 3C) will have an area associated with it. According to the present invention, an area 315-318 associated with the border region 312-313 may have an area type 322-327 associated with the area 315-318. An area 312A included in the border region 312-313 may be allocated according to a ratio based upon a hierarchical relationship between the adjacent areas (e.g., area 315 and area 317 or area 317 and area 318) or according to a user input (wherein the user input may be programmed to override and automated hierarchical relationship or be subservient to the automated hierarchical relationship). For example, as indicated in the table, a private office located adjacent to a private office may have an area in a border region split between the two adjacent areas in a 50/50 ration, but a private office adjacent to a general office space may be allocated 60 percent of an area included in a border region, and so on.

Dominance associated with various areas may be systemic throughout a project, according to customer preference, indicated on a two-dimensional reference by two-dimensional reference basis or another defined basis.

Figure 4A:
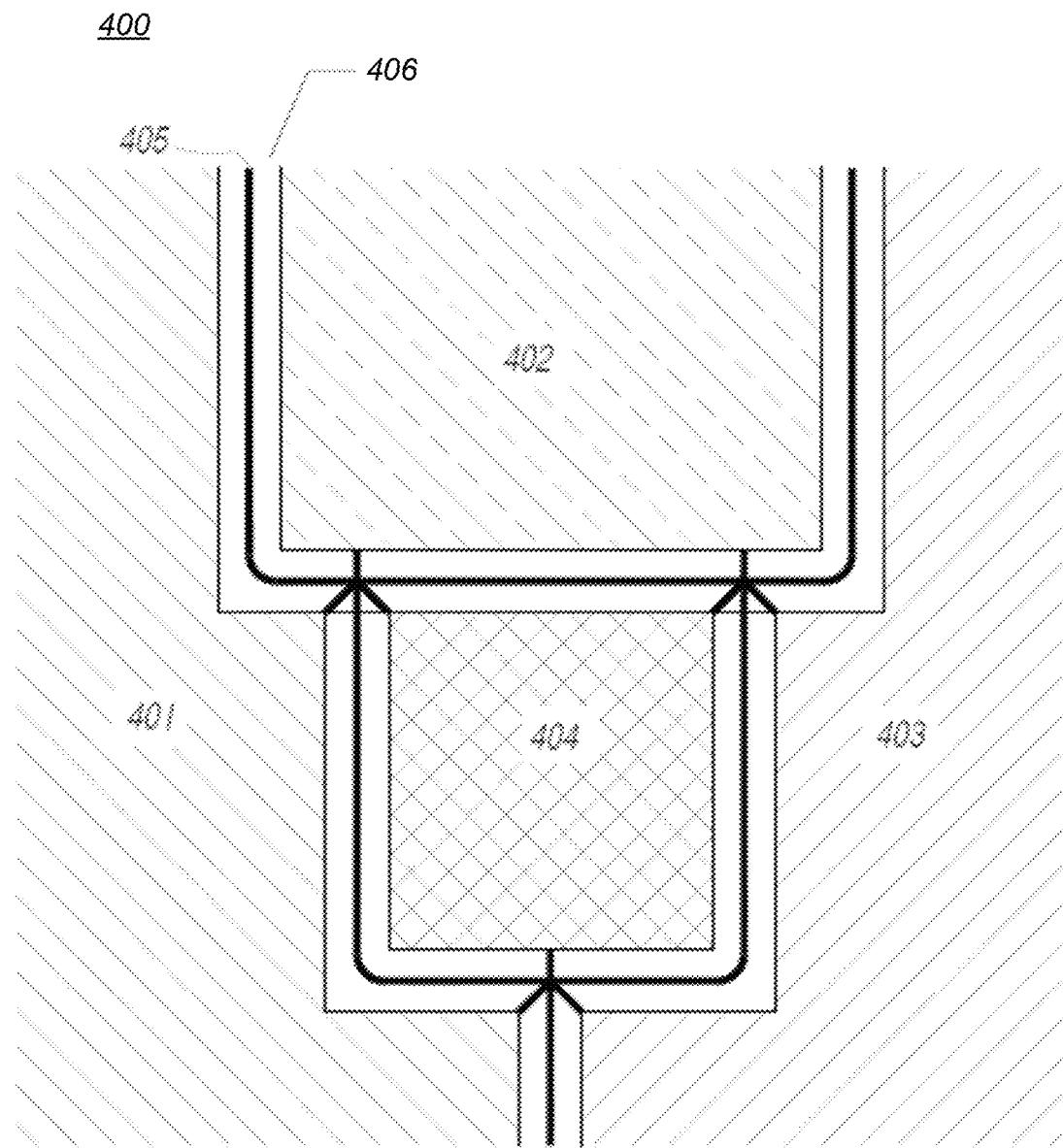

Referring now to FIG. 4A, an exemplary user interface 400 may include boundaries and regions overlaid on aspects included in a two-dimensional reference is illustrated. A defined space within a boundary (sometimes referred to as a region or area) may include an entire area within perimeters of a structure.

For example, a controller running an AI engine may determine locations of boundaries, edges and inflections of adjacent areas 401-404. There may be portions of boundary regions 405 and 406 that are initially not associated with an adjacent area 401-404. The controller may be operative via executing the software to determine the nature of respective adjacent areas 401-404 on either side of a boundary, and apply a dominance based ranking upon an area type, or an allocation of respective adjacent areas 401-404. Different classes or types of spaces or areas may be scored to be dominant (e.g., above) other or subservient (e.g. below) others.

Referring now to FIG. 4B, an exemplary table A indicating classes of space types and their associated ranks. In some embodiments, a controller may be operative via execution of software to determine relative ranks associated with a on one or either side of a boundary. For example, first area 402 may represent office space and second area 404 may represent a stair well. An associated rank lookup value for office space may be found at rank 411, and the associated rank lookup value for stairwells may be found at rank 413. Since the rank 431 of stairwells may be higher, or dominant, over the rank 411 of office space then the boundary space may be associated with the dominant stairs 412 or stairwell space. In some embodiments, a dominant rank may be allocated to an entirety of boundary space at an interface region. In other examples, more complicated allocations may be made where the dominant rank may get a larger share of boundary space than another rank allocated by some functional relationship. In still other examples (Table B), controller may execute logical code to be operative to assign pre-established work costs to elements identified within boundaries.

In some embodiments, a boundary region may transition from one set of interface neighbors to a different set. For example, again in FIG. 4A, a boundary 405 between office region 402 and stairwell 404 may transition to a boundary region between office region 402 and unallocated space 403. The unallocated space may have a rank associated with the unallocated space 403 that is dominant. Accordingly, the nature of allocated boundary space 405 may change at such transitions where one space may receive allocation of boundary space in one pairing and not in a neighboring region. The allocation of the boundary space 405 may support numerous downstream functionalities, and provide an input to various application programs. Summary reports may be generated and/or included in an interface based upon a result after incorporation of assignment of boundary areas.

In another aspect, Table B illustrates variables that may have values designated by an AI engine or other process run by a controller based upon the two dimensional reference, such as a floor plan, design plan or architectural blueprint. The variables include aspects that may effect an amount of time, worker hours, and materials involved in a project based upon the two dimensional reference. For example, as illustrated, variables may include delineated items 414, units 415 of the items 414, work type 416, work quantity 417, work hours 418, additional costs 419, expedite cost 420, line item cost 421, and a total of any of the above variables 414-415.

AREA TAKEOFF CLASSIFICATION

The determination of boundary definitions for a given inputted two dimensional references, which may be a single drawing or set of drawings or other image, has many important uses and aspects as has been described. However, it can also be important for a supporting process executed by a controller, such as an AI algorithm to take boundary definitions and area definitions and generate classifications of a space. As mentioned, this can be important to support processes executed by a controller that assign boundary areas based on dominance of these classifications.

Classification of areas can also be important for further aggregations of space. In a non-limiting example, accurate automatic classification of room spaces may allow for a combination of all interior spaces to be made and presented to a user. Overlays and boundary displays can accordingly be displayed for such aggregations. There may be numerous functionality and purpose to automatic classification of regions from an input drawing.

An AI engine or other process executed by a controller may be refined, trained or otherwise instructed to utilize a number of recognized characteristics to accomplish area classification. For example, an AI engine may base predictions for a type "/"category" of a region with a starting point of the determination that a region exists from the previous predictions by the segmentation engine.

In some embodiments, a type may be inferred from text located on an input drawing or other two-dimensional reference. An AI engine may utilize a combination of factors to classify a region, but it may be clear that the context recognized text may provide direct evidence upon which to infer a decision. For example, a recognized textual comment in a region may directly identify the space as a bedroom, which may allow the AI engine to make a set of hierarchical assignments to space and neighboring spaces, such as adjoining bathrooms, closets, and the like.

Classification may also be influenced by, and use, a geometric shape of a predicted region. Common shapes of certain spaces may allow a training set to train a relevant AI engine to classify a space with added accuracy. Furthermore, certain space classes may typically fall into ranges of areas which also may aid in the identification of a region's class. Accordingly, it may be important to influence the makeup of training sets for classification that contain common examples of various classes as well as common variations on that theme.

Figure 5A:
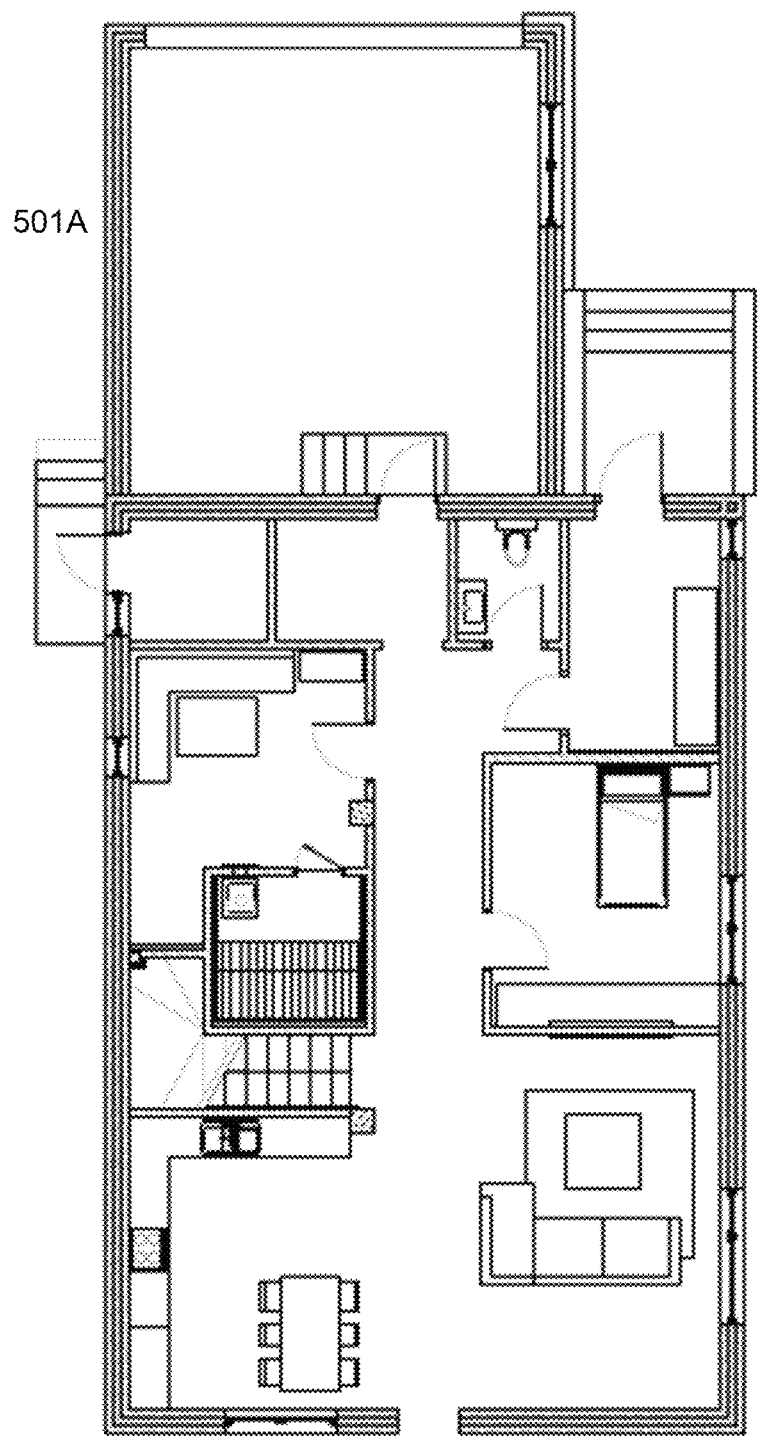
FIGS. 5A-5D illustrate various aspects of region identification and area allocation.

Referring now to FIGS. 5A-5D, a progressive series of illustrations provides examples of a recognition process that may be implemented in some embodiments of the present invention. Referring now to FIG. 5A, a relatively complex drawing of a floorplan 501C may be input as a two-dimensional reference 501A into a controller running an AI engine. The two dimensional reference 501 may be included in an initial user interface 500A.

Figure 5B:
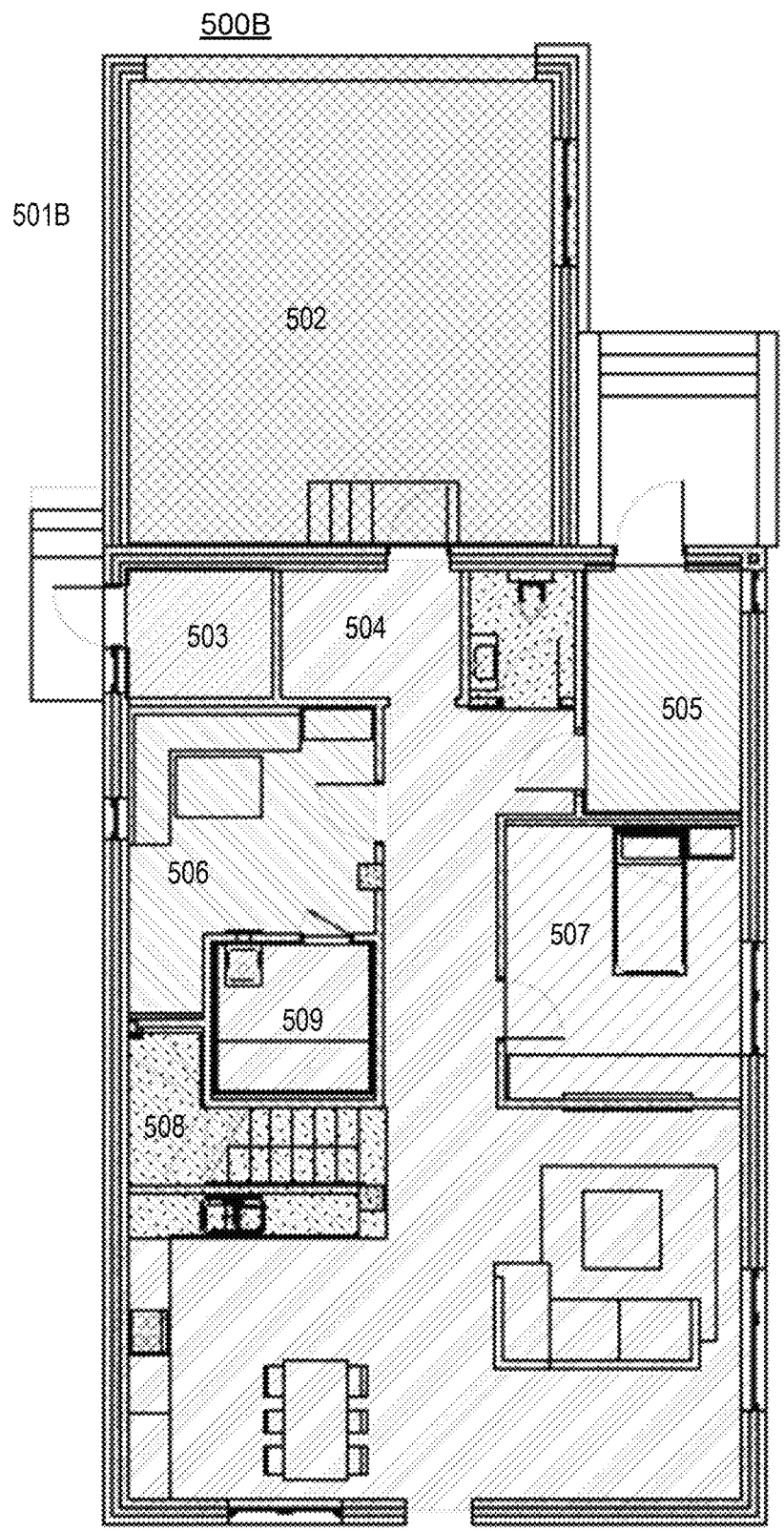

An AI engine automated recognition process executes method steps in via a controller, such as a cloud server, and identifies multiple disparate regions 502-509. Designation of the regions 502-509 may be integrated according to a shape and scale of the two dimensional reference and presented as a region view 501B user interface 500B, with symbolic hatches or colors etc. as shown in FIG. 5B.

The region view 501B may include the multiple regions 502-509 identified by the AI engine arranged based upon to a size and shape and relative position derived from the two dimensional reference 501.

Figure 5C:
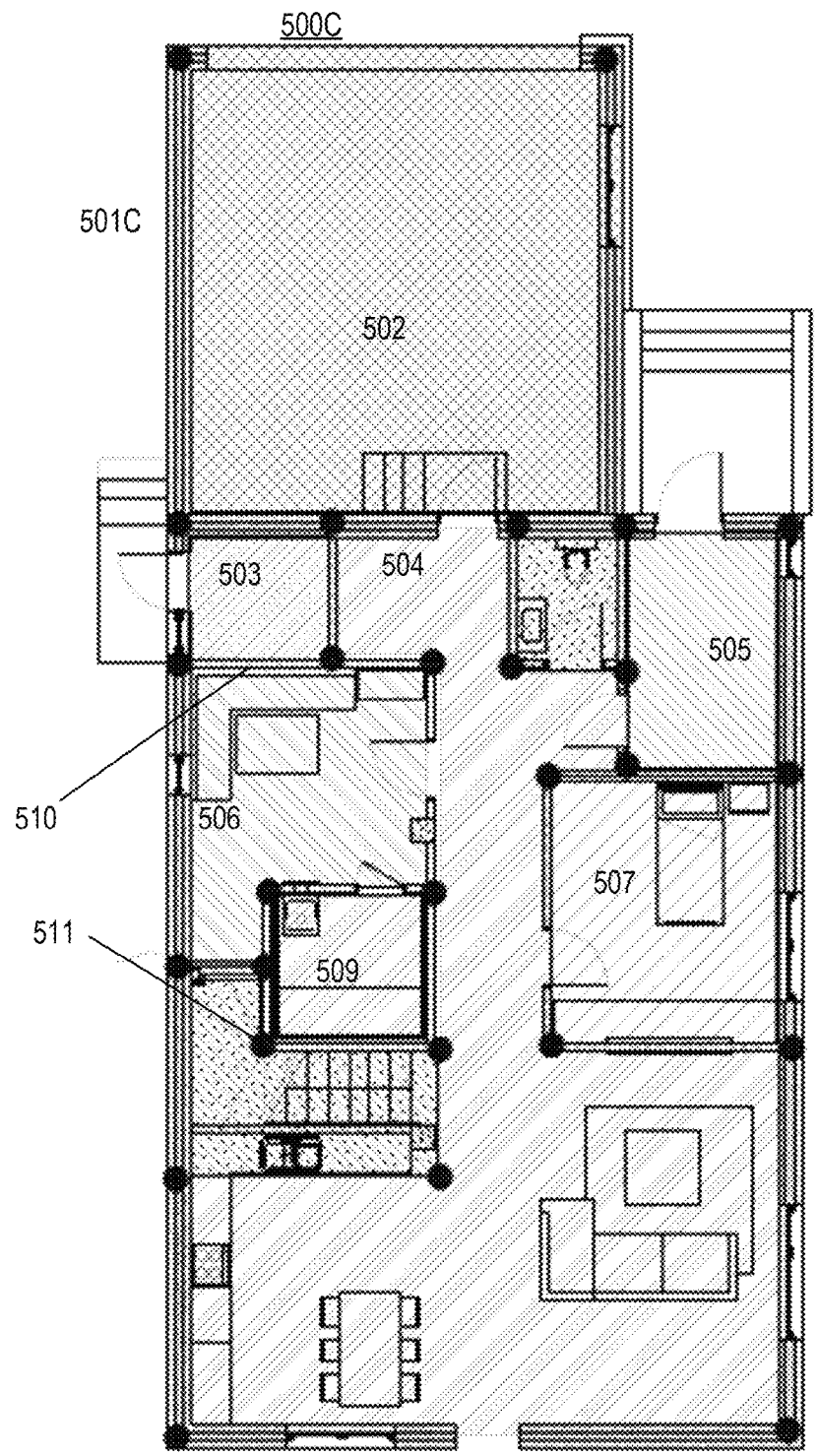

Referring now to FIG. 5C, identified boundary vectors 510 and vertices 511 may also be presented as an overlay of the regions 502-509 illustrated as delineated symbolic hatches or colors etc. as illustrated in FIG. 5C. Said vertices may represent boundary vectors 510 may also be represented as symbols such as but not limited to nodes 510. Such an interactive user interface 500C may allow a user to review and correct assignments in some cases. A component of the AI engine may further be trained to recognize aggregations of regions 502-509 spaces, or areas, such as in a non-limiting sense the aggregation of internal regions 502-509, spaces or areas.

Figure 5D:
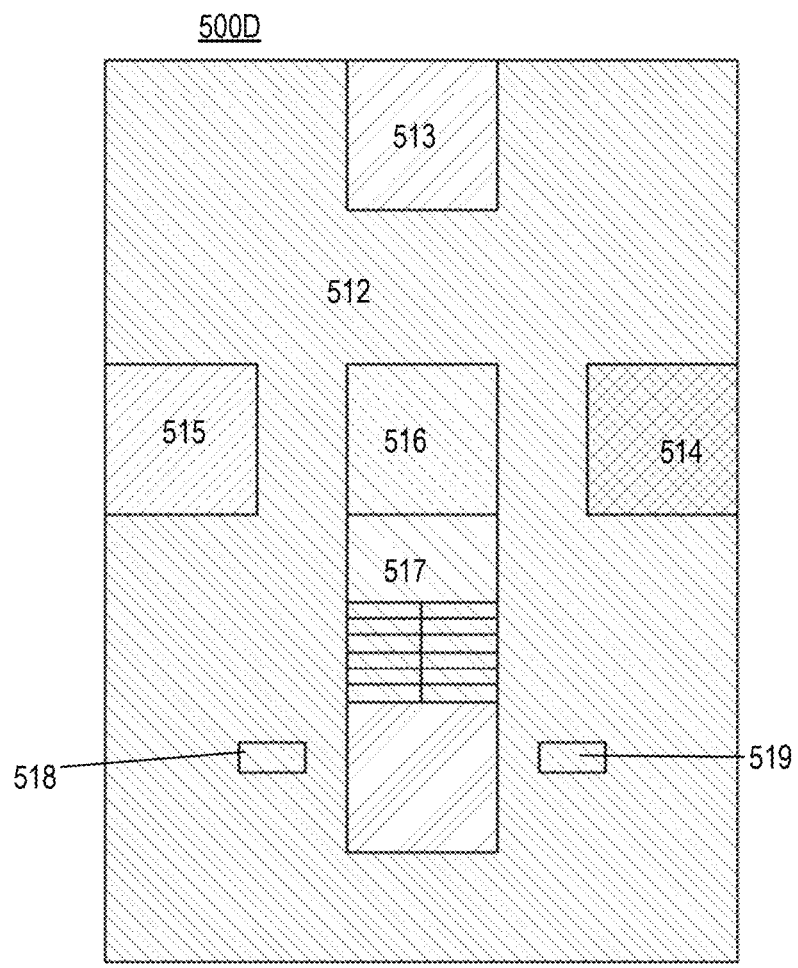

Referring now to FIG. 5D, an illustration of exemplary aggregation of regions 512-519 is provided where a user interface 500D includes patterned portions 512-519 and the patterned portions 512-519 may be representative of regions, spates, or areas, such as, for example aggregated interior living spaces.

Figure 6A:
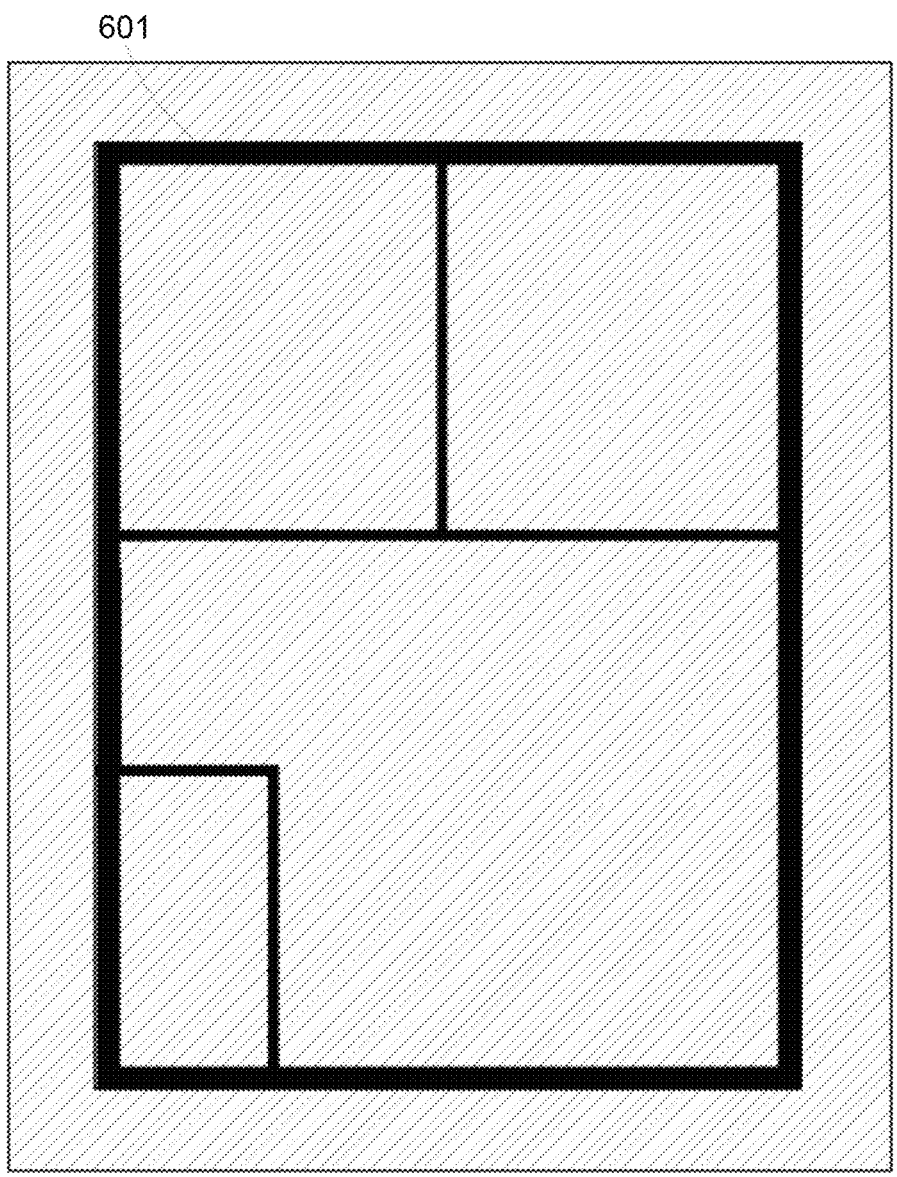
FIGS. 6A-6C illustrate various aspects of boundary segmentation and classification.
Figure 6B:
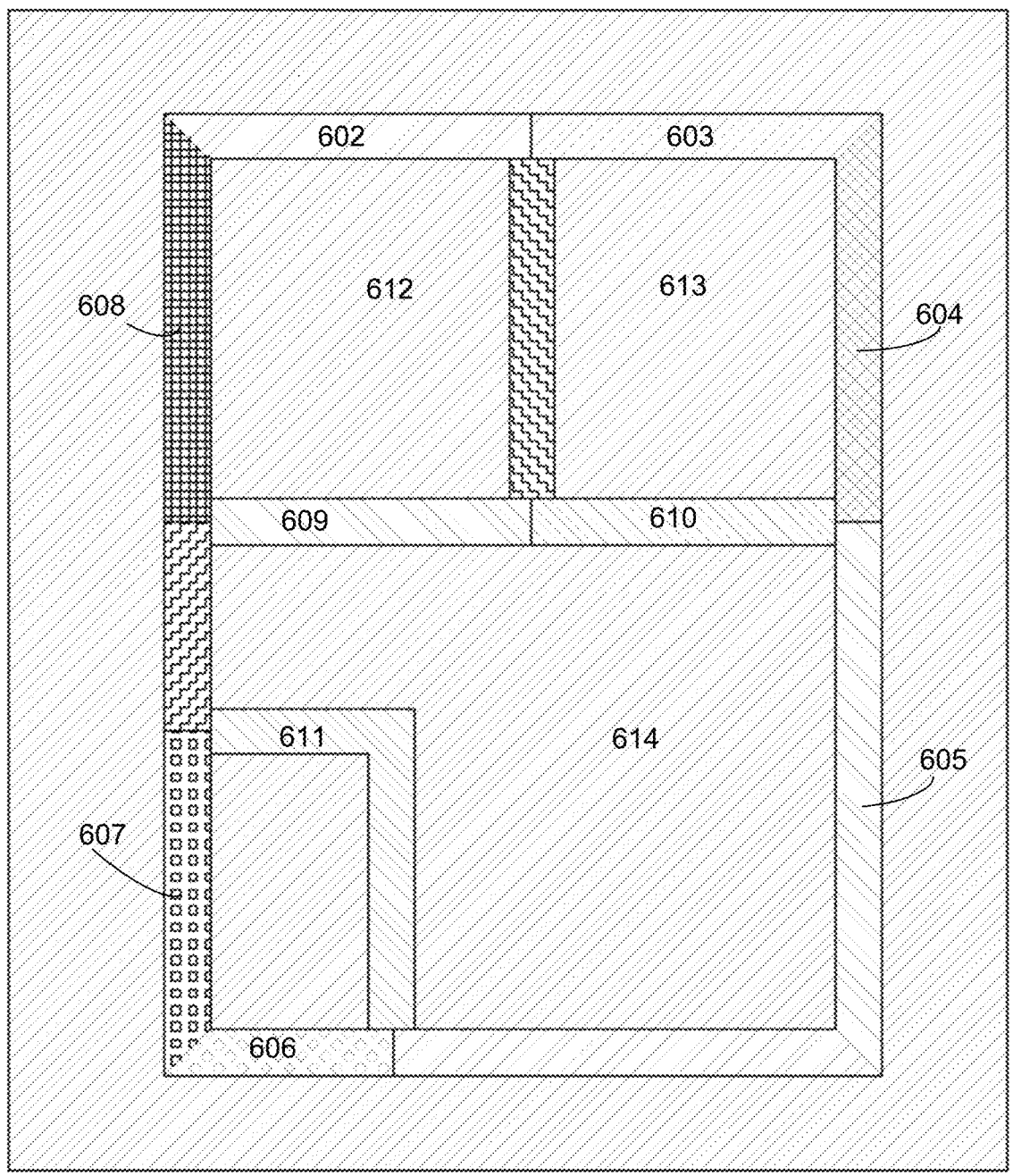
Figure 6C:
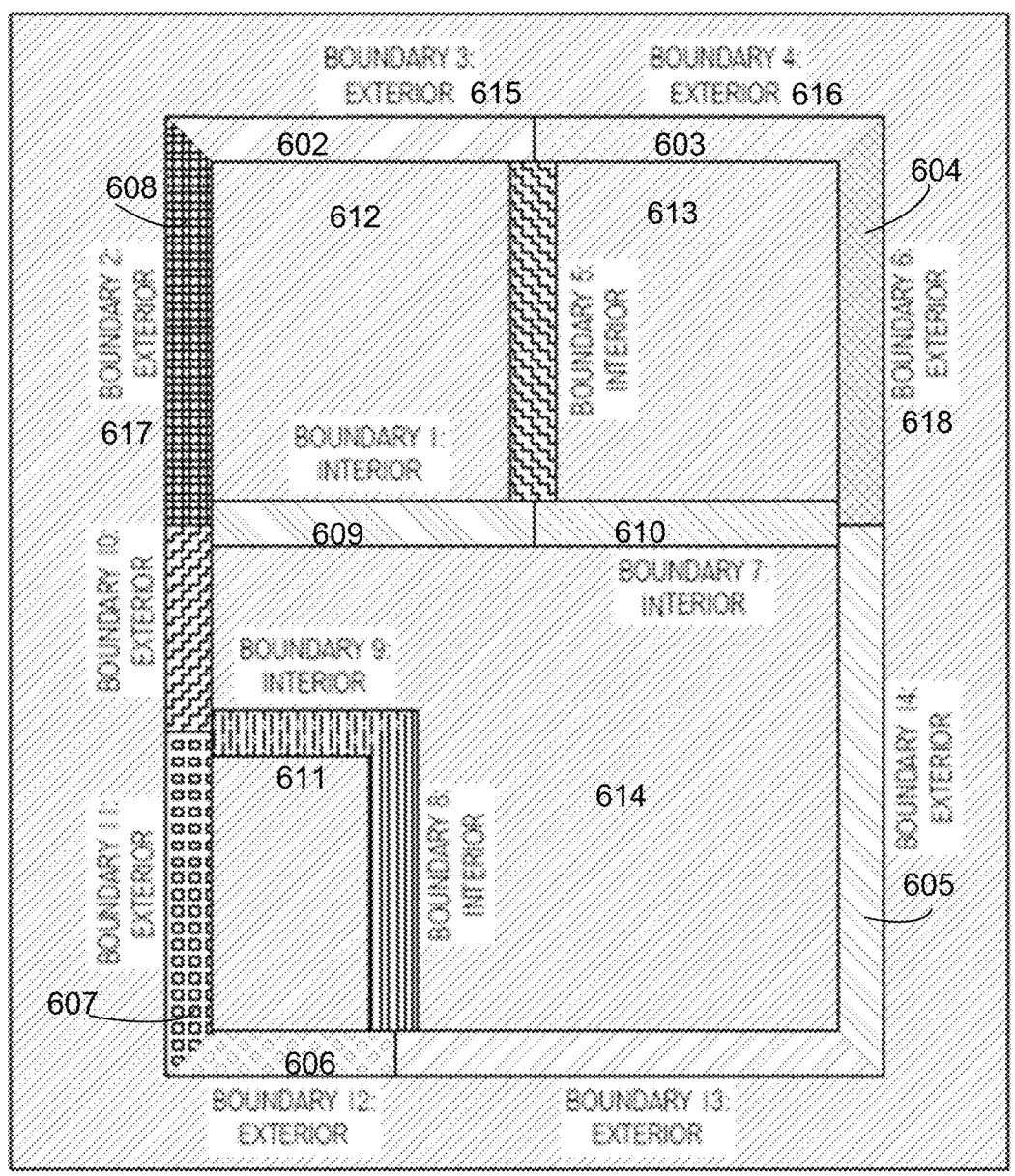

Referring now to FIGS. 6A-6C, in some embodiments. In some embodiments, refinement of regions, spaces, or areas may involve one or both of a user and a controller identifying individual wall segments from previously defined boundaries.

For example, in some embodiments, a controller running an AI engine may execute process that is operative to divide previously predicted boundary into individual wall segments. In FIG. 6A, a user interface 600A includes a representation of a two dimensional representation with an original boundary 601 defined from an inputted design.

In FIG. 6B, an AI engine may be operative to take one or more original boundaries 601 and isolate individual line segments 602-611 as shown by different hatching symbols in an illustrated user interface 600B. The identification of individual line segments 602-611 of a boundary 601 enables one or both of a controller and a user to assign and/or retrieve information about the individual line segment 602-611 such as, for example, one or more of: the length of the individual line segment 602-611, a type of wall for individual line segment 602-611, materials used in the wall for individual line segment 602-611, parameters of the individual line segment 602-611, height of the individual line segment 602-611, width of the individual line segment 602-611, allocation of the individual line segment 602-611 to a region 612-614 or another, and almost any digital content relevant to the segment.

Referring now to FIG. 6C, in some embodiments, a controller executing an AI engine or other method steps, may be operative, in some embodiments, to classify boundary of the individual line segments 602-611 and present a user interface 600C indicating the classified individual line segments 602-611. The AI engine may be trained, and subsequently operative to classify boundaries of the individual line segments 602-611 in different classes. As a non-limiting example, an AI engine may classify walls as interior walls, exterior walls and/or demising walls that separate internal spaces.

As illustrated in FIG. 6C, in some embodiments, an individual line segment 602-611 may be classified by the AI engine and an indication of the classification 615-618, such as alphanumeric or symbolic content, may be associated with the individual line segment 602-611 and presented in the user interface 600C.

In some embodiments, functionality may be allocated to classified individual line segments 602-611, such as, by way of non-limiting example, a process that generates an estimated materials list for a region or an area defined by a boundary, based on the regions or area's characteristics and its classification.

Figure 7:
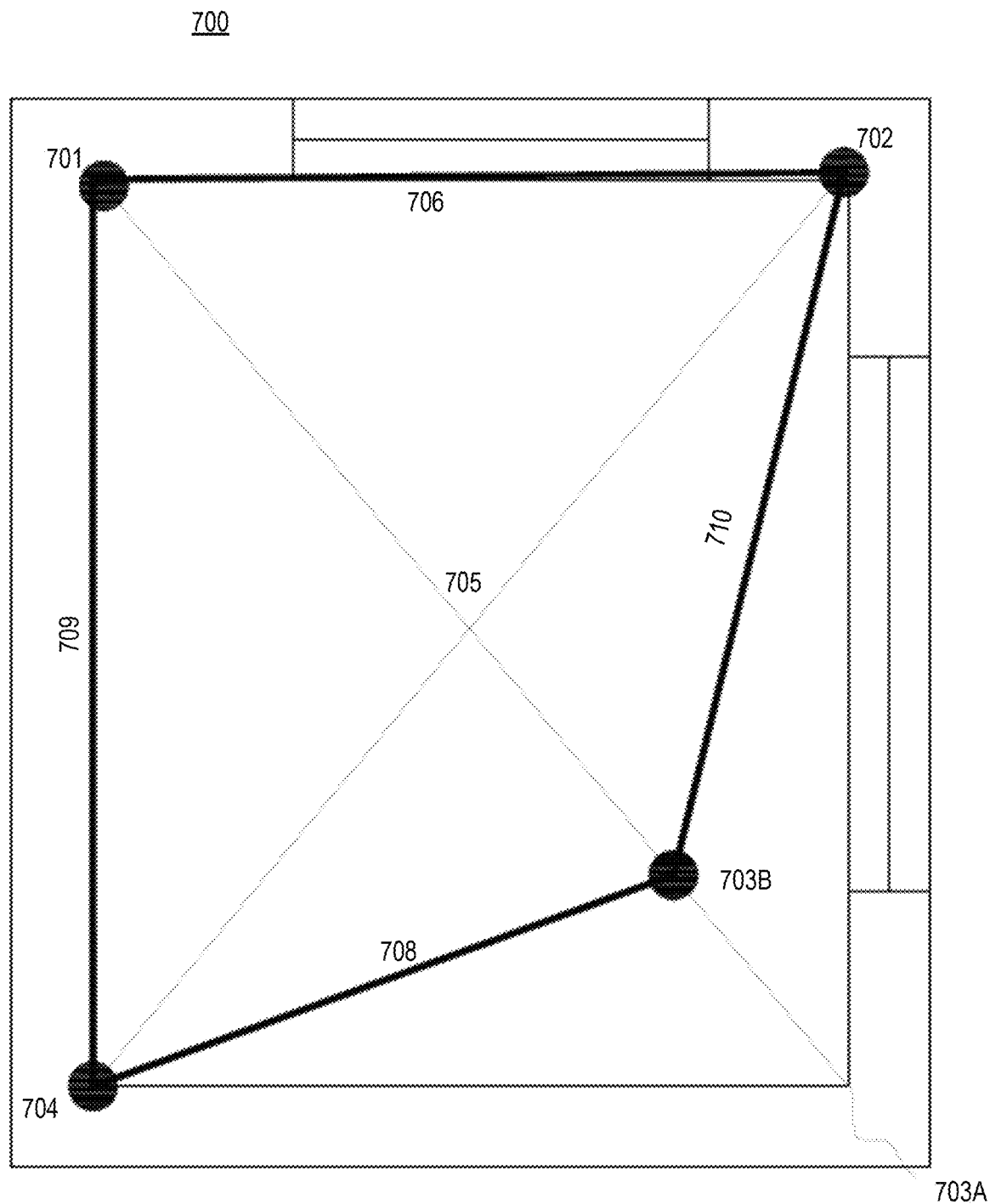
FIG. 7 illustrates aspects of correction protocols.

Referring now to FIG. 7 in some embodiments, a user interface 700 may include user interactive controls an AI engine may, in some embodiments, be operative to execute process steps described herein (e.g. make a boundary determination, region classification, segmentation decision or the like) in an automated process and to then receive an instruction (e.g. from a user via a user interface, or a machine running a separate process) that modifies an output of the AI engine process.

For example, a user interface may include one or more vertex 701-704 that may be user interactive such that a user may position the vertex 701-704 at a user selected position. User positioning may include, for example, user drag and drop of the vertex 701-704 at a desired location or entering a desired position, such as via coordinates. A new position for a vertex 703B (as opposed to an original position of a vertex 703A) may allow an area 705 bounded by user defined boundaries 706-710. User interactive portions of a user interface 700 are not limited to vertex 701-704 and can be any other item (e.g. vertex 701-704, boundaries 706-710) in the user interface 700 that may facilitate achievement of a propose by allowing one or both of: the user, and the controller, to control dynamic sizing and/or placement of an item (e.g.; 701-710).

Still further, in some embodiments, user interaction involving positioning of a vertex 701-704 or any outer item (e.g.; 705-710) may be used to train an AI engine to improve performance.

MODEL TRAINING PROCEDURES

An important aspect of the operation of the systems as have been described is the training of the AI engines that perform the functions as have been defined. A training dataset may involve a set or input drawings associated with a corresponding set of verified outputs. In some embodiments, a historical database of drawings may be analyzed by personnel with expertise in the field user, including in some embodiments experts in a particular filed of endeavor may manipulate dynamic aspects of a user interface to be used to train an AI engine, such as by creating or adding to an AI referenced database.

In some other examples, a trained version of an AI engine may produce user interfaces and/or other outputs based on the trained version of the AI engine. Teams of experts may review the results of the AI processing and make corrections as required. Corrected drawings may be provided to the AI engine for renewed training.

ESTIMATION AUTOMATION

Aspects that are determined by a controller running an AI engine to be represented in a two-dimensional reference may be used to generate an estimate of what will be required to complete a project. For example, according to some embodiments of the present invention: boundaries, areas, fixtures, architectural components, perimeters, linear lengths, distances, volumes and the like may be determined by a controller running an AI engine to be required to be required to complete a project. The AI engine received as input a two-dimensional reference.

For example, a derived area or region comprising a room and/or a boundary, perimeter or other beginning and end indicator may allow for a building estimate that may integrate choices of materials with associated raw materials costs and with labor estimates all scaled with the derived parameters. The boundary determination function may be integrated with other standard construction estimation software and feed its calculated parameters through APIs. In other examples, the boundary determination function may be supplemented with the equivalent functions of construction estimation to directly provide parametric input to an estimation function. For example, the parameters derived by the boundary determinations may result in estimation of needed quantities like cement, lumber, steel, wall board, floor treatments, carpeting and the like. Associated labor estimates may also be calculated.

As described herein, a controller executing an AI engine may be functional to perform pattern recognition and recognize features or other aspects that are present within an input two dimensional reference or other graphic design. In a segmentation phase used to determine boundaries of regions or other space features, aspects that are recognized as some artifact other than a boundary may be replaced or deleted from the image. An AI engine and/or user modified resulting boundary determination can be used in additional pattern recognition processing to facilitate accurate recognition of the non-wall features present in the graphic.

For example, in some embodiments, a set of architectural drawings may include many elements depicted such as, by way of non-limiting example, one or more of: windows, exterior doors, interior doors, hallways, elevators, stairs, electrical outlets, wiring paths, floor treatments, lighting, appliances, and the like. In some two dimensional references, furniture, desks, beds, and the like may be depicted in designated spaces. AI pattern recognition capabilities can also be trained to recognize each of these features and many other such features commonly included in design drawings. In some embodiments, a list of all the recognized image features may be created and also used in the cost estimation protocols as have been described.

In some embodiments of the present invention, a recognized feature may truly be accompanied on a drawing with textual description which may also be recognized by the AI image recognition capabilities. The textual description may be assessed in the context of the recognized physical features in its proximity and used to supplement the feature identification. Identified feature elements may be compared to a database of feature elements, and matched elements may be married to the location an the architectural plan. In some embodiments, text associated with dimensioning features may be used to refine the identity of a feature. For example, a feature may be identified as an exterior window, but an association of a dimension feature may allow for a specific window type to be recognized. As well, a text input or other narrative may be recognized to provide more specific identification of a window type.

Identified features may be associated with a specific item within a features database. The item within the features database may have associated records that precisely define a vector graphics representation of the element. Therefore, an input graphic design may be reconstituted within the system to locate wall and other boundary elements and then to superimpose a database element graphic associated with the recognized feature. In some embodiments, various feature types and text may be associated into separate layers of a processed architectural design. Thus, a user interface or other output display or on reports, different layers may be illustrated at different times along with associated display of estimation results.

In some embodiments, a drawing may be geolocated by user entry of data associated with the location of a project associated with the input architectural plans. The calculations of raw material, labor and the like may then be adjusted for prevailing conditions in the selected geographic location. Similarly, the geolocation of the drawing may drive additional functionality. The databases associated with the systems may associate a geolocation with a set of codes, standards and the like and review the discovered design elements for compliance. In some embodiments, a list of variances or discovered potential issues may be presented to a user on a display or in at report form. In some embodiments, a function may be offered to remove user entered data and other personally identifiable information associated in the database with a processing of a graphic image.

In some embodiments, a feature determination that is presented to a user in a user interface may be assessed as erroneous in some way by the user. The user interface may include functionality to allow the user to correct the error. The resulting error determination may be included in a training database for the AI engine to help improve its accuracy and functionality.

CONTROLLERS AND MOBILE SMART DEVICES

Figure 8:
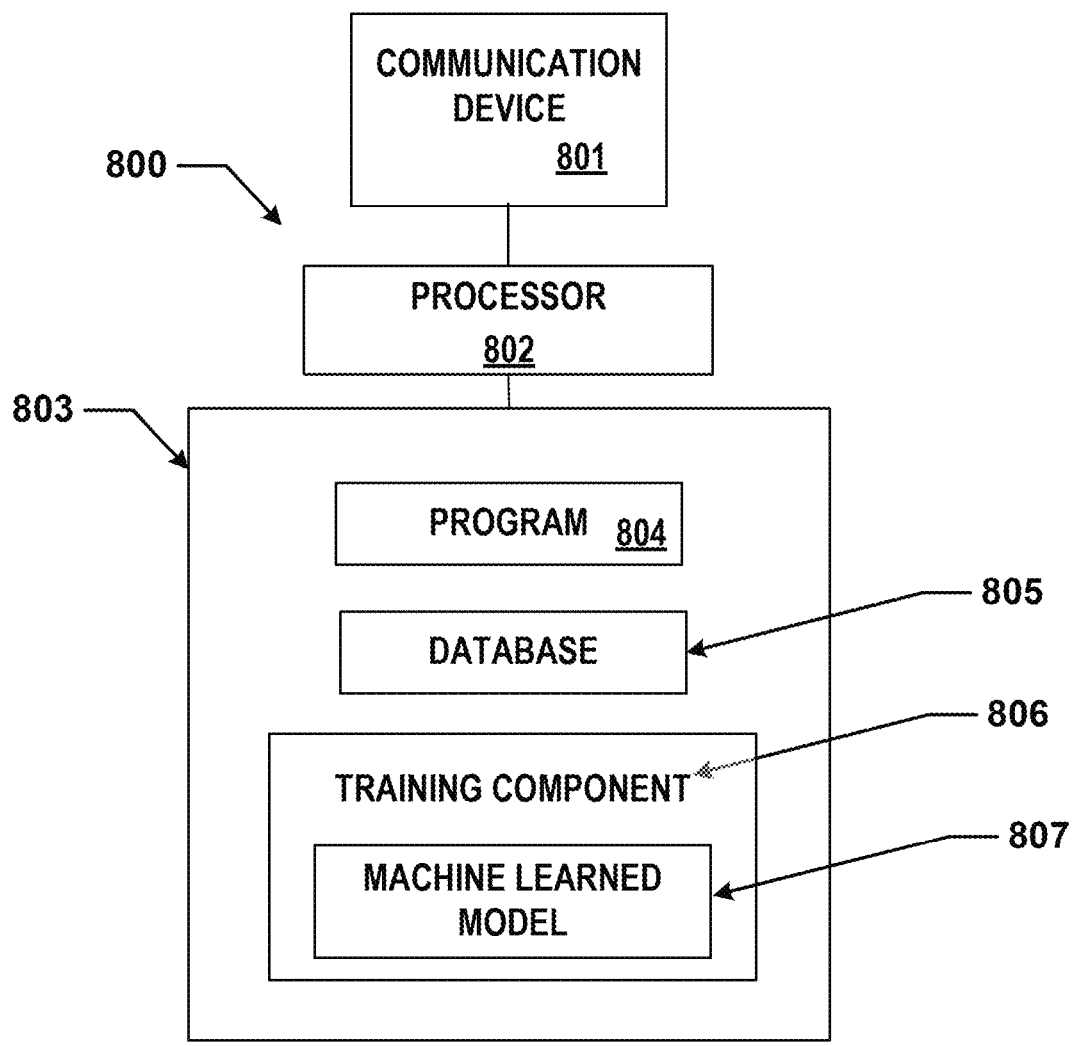
FIG. 8 illustrates exemplary processor architecture for use with the present disclosure.

Referring now to FIG. 8 an automated controller is illustrated that may be used to implement various aspects of the present disclosure, in various embodiments, and for various aspects of the present disclosure, controller 800 may be included in one or more of: a wireless tablet or handheld device, a server, a rack mounted processor unit. The controller may be included in one or more of the apparatuses described above, such as a Server, and a Network Access Device. The controller 800 includes a processor unit 802, such as one or more semiconductor-based processors, coupled to a communication device 801 configured to communicate via a communication network (not shown in FIG. 8). The communication device 801 may be used to communicate, for example, with one or more online devices, such as at personal computer, laptop, or a handheld device.

The processor unit 802 is also in communication with a storage device 803. The storage device 803 may comprise any appropriate information storage device, including combinations of magnetic storage devices (e.g., magnetic tape and hard disk drives), optical storage devices, and/or semiconductor memory devices such as Random Access Memory (RAM) devices and Read Only Memory (ROM) devices.

The storage device 803 can store a software program 804 with executable logic for controlling the processor unit 802. The processor unit 802 performs instructions of the software program 804, and thereby operates in accordance with the present disclosure. In some embodiments, the processor may be supplemented with a specialized processor for AI related processing. The processor unit 802 may also cause the communication device 801 to transmit information, including, in some instances, control commands to operate apparatus to implement the processes described above. The storage device 803 can additionally store related data in a database 805. The processor and storage devices may access an AI training component 806 and database, as needed which may also include storage of machine learned models 807.

Figure 9:
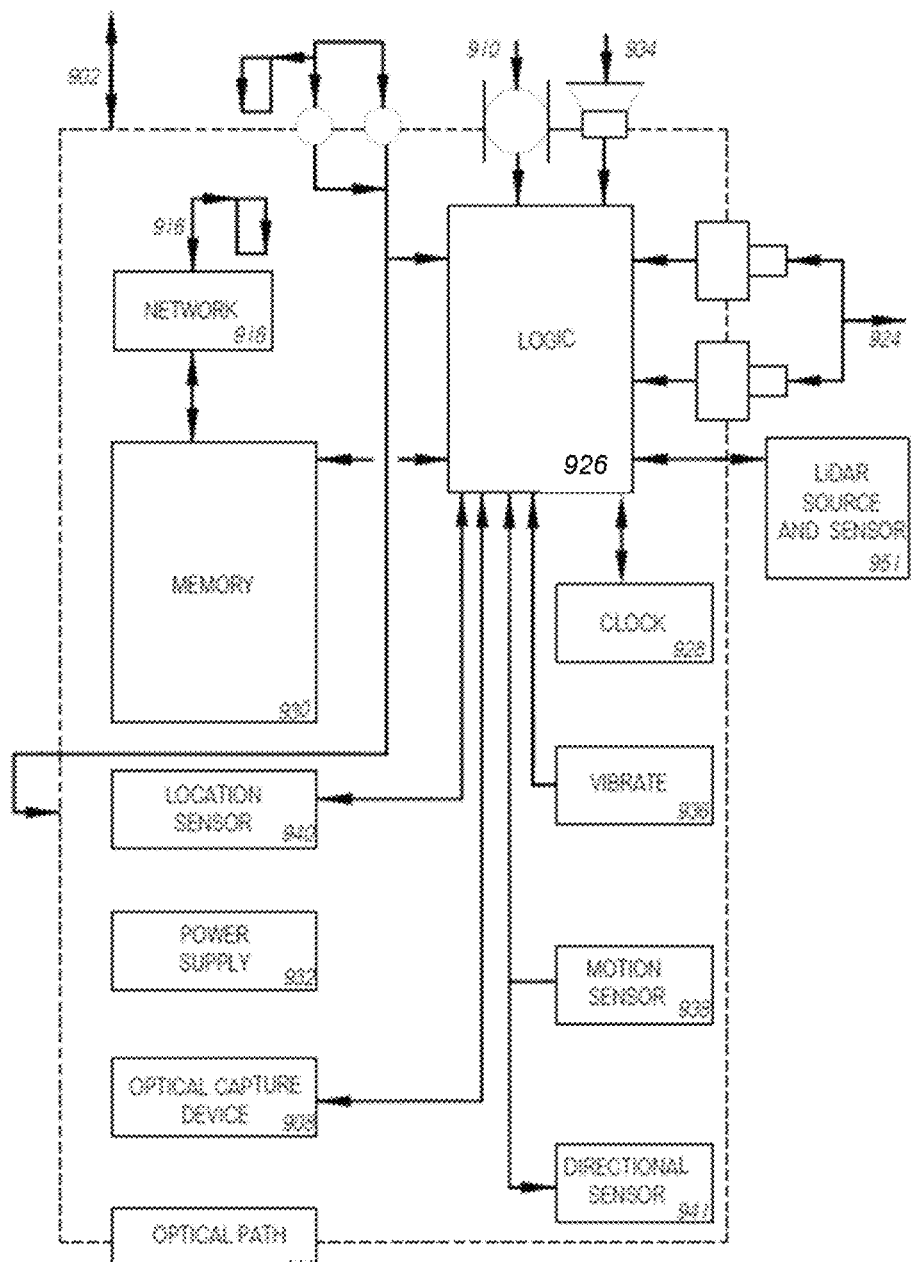
FIG. 9 illustrates exemplary mobile device architecture for use with the present disclosure.

Referring now to FIG. 9, a block diagram of an exemplary mobile device 902 is illustrated. The mobile device 902 comprises an optical capture device 908 to capture an image and convert it to machine compatible data, and an optical path 906, typically a lens, an aperture, or an image conduit to convey the image from the rendered document to the optical capture device 908. The optical capture device 908 may incorporate a Charge-Coupled Device (CCD), a Complementary Metal Oxide Semiconductor (CMOS) imaging device, or an optical Sensor 924 of another type.

A microphone 910 and associated circuitry may convert the sound of the environment, including spoken words, into machine-compatible signals. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible feedback 934 may come from a loudspeaker or other audio transducer. Tactile feedback may come from a vibrate module 936.

A motion Sensor 938 and associated circuitry covert the motion of the mobile device 902 into machine-compatible signals. The motion Sensor 938 may comprise an accelerometer that may be used to sense measurable physical acceleration, orientation, vibration, and other movements. In some embodiments, motion Sensor 938 may include a gyroscope or other device to sense different motions.

A location Sensor 940 and associated circuitry may be used to determine the location of the device. The location Sensor 940 may detect Global Position System (GPS) radio signals from satellites or may also use assisted GPS where the mobile device may use a cellular network to decrease the time necessary to determine location.

The mobile device 902 comprises logic 926 to interact with the various other components, possibly processing the received signals into different formats and/or interpretations. Logic 926 may be operable to read and write data and program instructions stored in associated storage or memory 930 such as RAM, ROM, flash, or other suitable memory. It may read a time signal from the clock unit 928. In some embodiments, the mobile device 902 may have an on-board power supply 932. In other embodiments, the mobile device 902 may be powered from a tethered connection to another device, such as a Universal Serial Bus (USB) connection.

The mobile device 902 also includes a network interface 916 to communicate data to a network and/or an associated computing device. Network interface 916 may provide two-way data communication. For example, network interface 916 may operate according to the internet protocol. Aa another example, network interface 916 may be a local area network (LAN) card allowing a data communication connection to a compatible LAN. As another example, network interface 916 may be a cellular antenna and associated circuitry which may a allow the mobile device to communicate over standard wireless data communication networks. In some implementations, network interface 916 may include a Universal Serial Bus (USB) to supply power or transmit data. In some embodiments other wireless links may also be implemented.

As an example of one use of mobile device 902, a reader may scan an input drawing with the mobile device 902. In some embodiments, the scan may include a bit-mapped image via the optical capture device 908. Logic 926 causes the bit-mapped image to be stored in memory 930 with an associated time-stamp read from the clock unit 928. Logic 936 may also perform optical character recognition (OCR) or other post-scan processing on the bit-mapped image to convert it to text.

A directional sensor 941 may also be incorporated into the mobile device 902. The directional device may be a compass and be based upon a magnetic reading or based upon network settings.

A LiDAR sensing system 951 may also be incorporated into the mobile device 902. The LiDAR system may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of the mobile device 902. In some embodiments, as have been described herein, a 2 dimensional drawing or representation may be used as the input data source and, vector representations in various forms may be utilized as a fundamental or alternative input data source. Moreover, in some embodiments, files which may be classified as BIM input files may be directly used as a source on which method steps may be performed. BIM and CAD file formats may include, by way of non-limiting example, one or more of: BIM, RVT, NWD, DWG, IFC and COBie. Features in the BIM of CAD datafile may already have defined boundary aspects having innate definitions such as walls and ceilings and the like. An interactive interface may be generated that receives input from a user indicating a user choice of types of innate boundary aspects a user provides instruction to the controller to perform subsequent processing on.

In some embodiments, a controller may receive user input enabling input data from either a two-dimensional reference format or similar such formats, or also allow the user to access BIM or CAD formats. Artificial intelligence may be used to assess boundaries in different manners depending on the type of input data that is initially inputted. Subsequently, similar processing may be performed to segment defined spaces in useable manners as have been discussed. The segmented spaces may also be processed to determining classifications of the spaces.

TAKEOFF AND AI RECOGNITION BASED ON POLYGONS

As has been described, a system may operate (and AI Training aspects may be focused upon) recognition of lines or vectors as a basic element within an input two dimensional representation. However, in some embodiments, other elements may be used as a fundamental element, such as, for example, a polygon and/or series of polygons. The one or more polygons may be assembled to define an area with a boundary, as compared, in some embodiments, with an assembly of line segments or vectors, which together may define a boundary which may be used to define an area. Polygons may include different vertices; however common examples may include triangular facets and quadrilateral polygons. In some embodiments, AI training may be carried out with a singular type of polygonal primitive element (e.g., rectangles), other embodiments will use a more sophisticated model. In some other examples, AI engine training may involve characterizing spaces where the algorithms are allowed to access multiple different types of polygons simultaneously. In some embodiments, a system may be allowed to represent boundary conditions as combinations of both polygons and line elements or vectors.

Depending on the complexity of the feature space defined after processing on input data of various types, simplification protocols may be performed as have been described herein. In some embodiments, object recognition, space definition or general simplification may be aided by various object recognition algorithms. In some embodiments, Hough type algorithms may be used to extract various types of features from a representation of a space. In other examples, Watershed algorithms may be useful to infer division boundaries between segmented spaces. Other feature recognition algorithms may be useful in determining boundary definitions from building drawings or representations.

USER INTERFACE WITH SINGLE AND MULTIPLE LAYERS

In some embodiments, the user may be given access to movement of boundary elements and vertices of boundary elements. In examples where lines or vectors are used to represent boundaries and surrounding area, a user may move vertices between lines or center points of lines (which may move multiple vertices). In other examples, elements of polygons such as vertices, sides, and center points may be moved by the user. In some embodiments, the determined elements of the space representation may be bundled together in a single layer. In other examples, multiple layers may be used to distinguish different aspects. For example, one layer may include the AI optimized boundary elements, another layer may represent area and segmentation aspects, and still another layer may include object elements. In some embodiments, when the user moves an element such as a vertex the effects may be limited only to elements within its own layer. In some examples, a user may elect to move multiple or all layers in an equivalent manner. In still further examples, all elements may be assigned to a single layer and treated equivalently. In some embodiments, users may be given multiple menu options to select disparate elements for processing and adjustment. Features of elements such as color and shading and stylizing aspects may be user selectable. A user may be presented with a user interface that includes dynamic representations of a takeoff representation and associated values and changes may be input by a user. In some embodiments, an algorithm and processor may present to the user comparisons of various aspects within a single model or between different models. Accordingly, in various embodiments, a controller and a user may manipulate aspects of a user interface and AI engine.

Figure 10A:
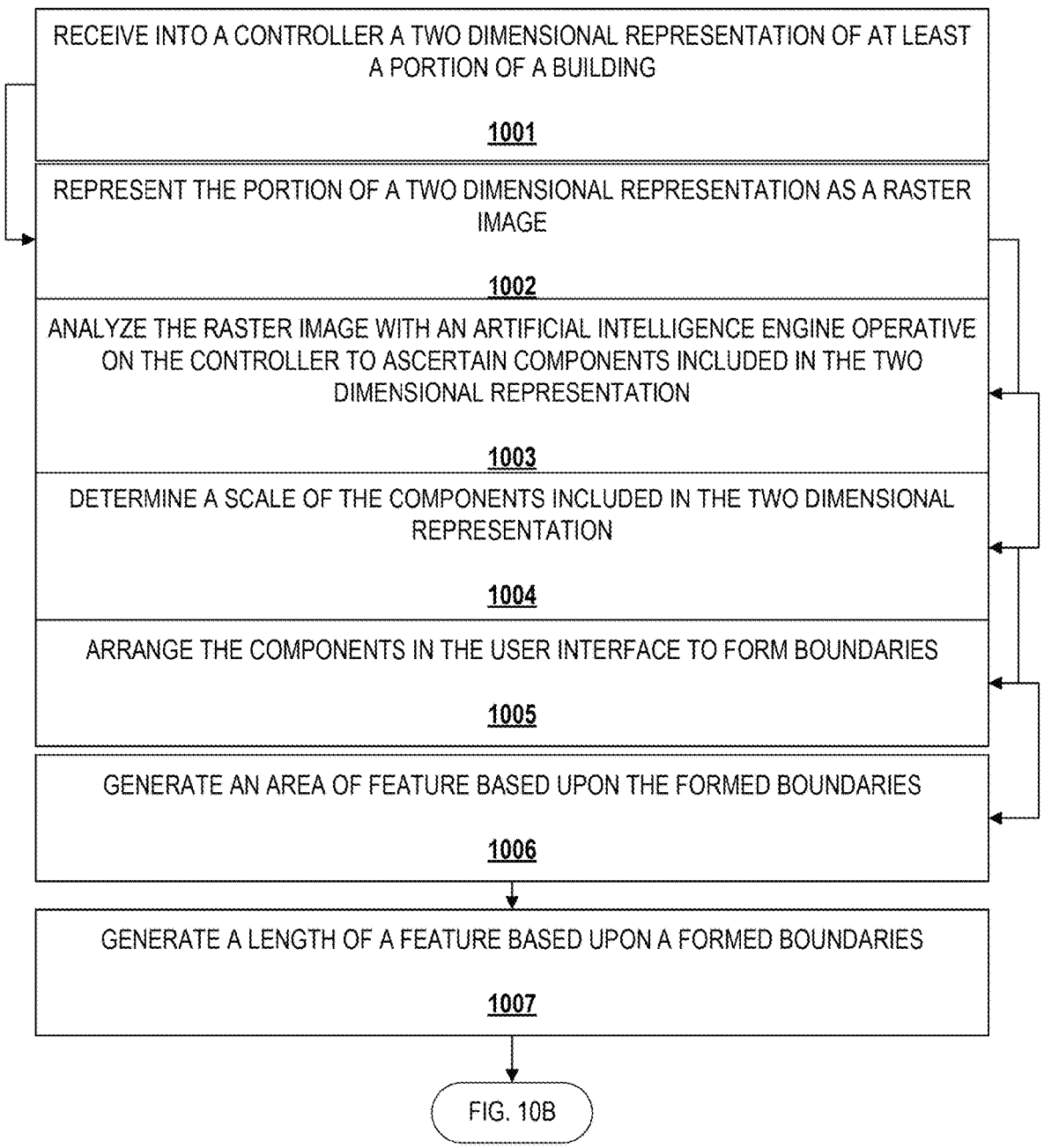
FIGS. 10A-10B illustrate additional method steps that may be executed in some embodiments of the present invention.
Figure 10B:
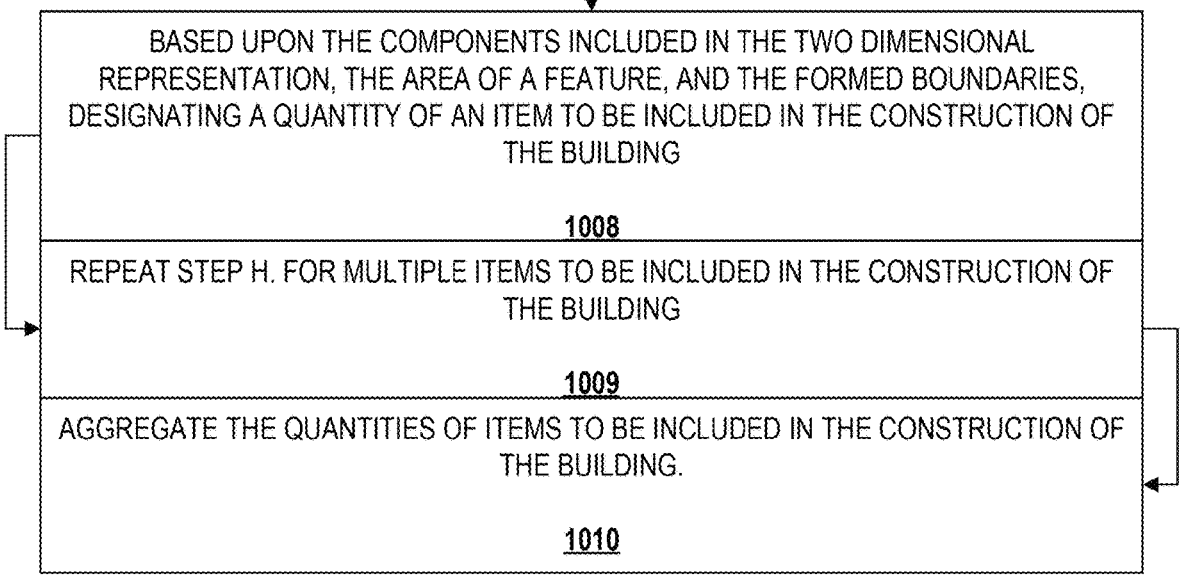

Referring now to FIGS. 10A-10B method steps are illustrated for quantifying requirements for construction of a building based upon artificial intelligence analysis of a two-dimensional reference according to some embodiments of the present invention. At step 1001, the method includes receiving into a controller two-dimensional representation of at least a portion of a building. As described above, the two-dimensional representation may include an architectural drawing, floor plan, design drawing and the like.

At step 1002, the portion of a two-dimensional representation may be represented as a raster image or other image type that is conducive to artificial intelligence analysis, such as, for example a pixel-based drawing.

At step 1003, the raster image may be analyzed with an artificial intelligence engine that is operative on a controller to ascertain components included in the two-dimensional representation.

At step 1004, a scale of components included in the two-dimensional representation may be determined. The scale may be determined for example via a scale indicator or ruler included the two-dimensional reference, or inclusion in the two-dimensional representation of a component of a known dimension.

At step 1005, a user interface may be generated that includes at least some of the multiple components.

At step 1006, the components may be arranged in the user interface to form boundaries.

At step 1007, a length of a feature may be generated based upon a formed boundary.

At step 1008, based upon one or more of components included in at least one or the user interface and the two-dimensional representation, at least one of: the area of a feature, space or region may be generated and/or a length of a feature may be generated and/or a quantity of an item to be included in the construction of the building may be designated and presented to a user, for example, in an interactive user interface.

At step 1009, one or more of the above steps may be repeated for multiple items to be included in construction of a building being described by the two-dimensional representation.

At step 1010, quantities of items to be included in the construction of the building may be aggregated and presented to a user. The aggregated quantities may be useful, for example to generate a bid or proposal for work to be provided by a subcontractor. For example, an amount of materials may be represented by a generated area and the subcontractor may use the amount of materials to calculate a cost of goods in a bid generated by them. Materials may include, by way example, square feet of flooring, square feet of wall board, square feet of ceiling material, length of piping, length of wiring, a quantity of fixture (either electrical or plumbing), a number and/or type of fasteners, a type and/or number of tools required, volume of cement or other pourable material, an amount of insulation, and almost any other material of item used during a construction project.

Other embodiments of this aspect include corresponding computer systems, apparatus, controllers, smart devices and computer programs recorded on one or more computer storage devices, each configured to perform the actions of the methods described herein. The method may additionally include one or more of the steps of: generating a user interface including user interactive areas to change at least one of: a size and shape of at least one of the dynamic components. At least one of the dynamic components may include a polygon and the method further includes the steps of: receiving an instruction via the user interactive interface to modify a parameter of the polygon, and modifying the parameter of the polygon based upon the instruction received via the interactive user interface. The parameter modified may include an area of the polygon. The parameter modified may include a shape of the polygon.

A dynamic component may also include a vector, and the method may further include the steps of: receiving an instruction via the user interactive interface to modify a parameter of the vector, and modifying the parameter of the vector based upon the instruction received via the interactive user interface. The parameter modified may include a magnitude of the vector. The parameter modified may also include a direction of the vector.

The methods may additionally include one or more of the steps of setting a boundary based upon reference to a boundary allocation hierarchy; associating a price with each of the quantities of items to be included construction of the building; totaling the aggregated prices of items to be included construction of the building; designating a type of labor associated with at least one of the items to be included construction of the building; designating a quantity of the type of labor associated with the at least the of the items to be included in construction of the building repeating the steps of designating a type or labor associated with at least one of the items to be included construction of the building and designating of quantity of the type of labor associated with the at least one of the items to be included in construction of the building for multiple items, and generating an aggregate quantity of the type of labor.

Still further method steps within the scope of the present invention include, one or more of associating a cost with the items to be included in the construction of the building and the aggregate quantity of the type of labor, wherein the items to be included in the construction of the building may include at least one of: a plumbing fixture, wall board, flooring, and electrical wiring. The method may additionally include the step of training the AI engine based upon a human identifying portions of a two-dimensional representation to indicate that it includes a particular type of item; or to identify portions of the two dimensional representation that include a boundary. The AI engine via may also be trained by reference to a boundary allocation hierarchy.

The methods may additionally include the steps of: determining whether the two dimensional representations received into the controller includes a vector image, and if the two dimensional representation received into the controller does include a vector image converting at least a portion of the vector image into a raster image; and/or whether a two dimensional representation includes a vector image format. Implementations of the described techniques and method steps may include hardware (such as a controller and/or computer server), a method or process, or computer software on a computer-accessible medium.

Glossary:

"Artificial Intelligence" as used herein means machine-based decision making and machine learning including, but not limited to: supervised and unsupervised recognition of patterns, classification and numerical regression. Supervised learning of patterns includes a human indicating that a pattern (such as a pattern of dots formed via the rasterization of a 2D image) is representative of a line, polygon, shape, angle or other geometric form, or an architectural aspect, unsupervised learning can include a machine finding a pattern submitted for analysis. One or both may use mathematical optimization, formal logic, artificial neural networks, and methods based on one or more of: statistics, probability, linear regression, linear algebra, and/or matrix multiplication.

"AI Engine" as used herein an AI Engine (sometimes referred to as an AI model) refers to methods and apparatus for applying artificial intelligence and/or machine learning to a task performed by a controller. In some embodiments, a controller may be operative via an AI engine to recognize aspects and/or tally aspects of a 2D representation that are relevant to generating an estimate for performing projects included in construction of a building or other activities related to construction of a building.

"Vector File" as used herein a vector file is a computer graphic that uses mathematical formulas to render its image. In some embodiments, a sharpness of a vector file will be agnostic to size within a range of sizes viewable on smart device and personal computer display screens.

Typically, a vector image includes segments with two points. The two points create a path. Paths can be straight or curved. Paths may be connected at connection points. Connected paths form more complex shapes. More points may be used to form longer paths or closed shapes. Each path, curve, or shape has its own formula, so they can be sized up or down and the formulas will maintain the crispness and sharp qualities of each path.

A vector file may include connected paths that may be viewed as graphics. The paths that make up the graphics may include geometric shapes or portions of geometric shapes, such as: circles, ellipsis, Bezier curves, squares, rectangles, polygons, and lines. More sophisticated designs may be created by joining and intersecting shapes and/or paths. Each shape may be treated as an individual object within the larger image. Vector graphics are scalable, such that they may be increased or decreased without significantly distorting the image.

CONCLUSION

A number of embodiments of the present disclosure have been described. While this specification contains many specific implementation details, there should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings and the detailed description thereto are not intended to limit the present disclosure to the form disclosed, but to the contrary, the present disclosure is to cover all modification, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" be used in a permissive sense (i.e., meaning having the potential to), rather than the mandatory sense (i.e., meaning must). Similarly, the word "include", "including", and "includes" mean including but not limited to. To facilitate understanding, like reference numerals have been used, where possible, to designate like elements common to the figures.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising", "including", and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or than all illustrated operations be performed, to achieve desirable results.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub combination or variation of a sub-combination.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. A method of generating a construction take-off based upon artificial intelligence analysis of a two-dimensional reference, the method comprising steps of:

with a controller, generating an interactive user interface based upon artificial intelligence analysis of a two-dimensional representation of at least a portion of a building;

with the controller, determining multiple components included in the two-dimensional representation;

with the controller, determining a scale of the multiple components included in the two-dimensional representation based upon a pixel count of a component of known length in a raster image representing the two-dimensional representation;

executing a transformation process to generate in the interactive user interface vertices comprising dynamic lines and dynamic polygons representing the multiple components as dynamic components descriptive of architectural aspects;

interacting with the interactive user interface to change a size or a shape of a dynamic component in the interactive user interface to form a boundary comprising a boundary area;

generating multiple adjacent regions in the interactive user interface, the multiple adjacent regions comprising respective region areas bordered by the boundary, and a respective region type;

allocating a dominance rank with each adjacent region type based on at least one of: a type of space, a perimeter including objects within the respective region areas, and an area associated with the respective region areas;

allocating more of an area included in the boundary area to one of the multiple adjacent regions determined to have a higher dominance rank allocated with the adjacent region type based on the at least one of: the type of space, the perimeter, and the area associated with the respective region areas;

allocating space between regions with a same dominance rank according to a 50/50 ratio split;

designating a material item to be included in a construction bid based upon at least one of: the multiple components, and the region areas;

based upon at least one of: the multiple components and the region areas, designating a quantity of the material item to be included in a construction takeoff;

generating the construction takeoff comprising the quantity of the material item; and displaying the construction takeoff in the interactive user interface.

2. The method of claim 1, wherein at least one boundary in the interactive user interface represents a wall included in the building.

3. The method of claim 1, additionally comprising a step of associating a cost for the quantity of the material item to be included in construction of the building.

4. The method of claim 3, additionally comprising a step of associating a cost of labor to install the material item in the construction of the building.

5. The method of claim 4, additionally comprising a step of generating a bid for completion of a project.

6. The method of claim 1, wherein the step of generating the interactive user interface comprises generating user interactive areas to change at least one of: the shape of the dynamic component and the size of the dynamic component; and updating the quantity of the material item to be included in the construction takeoff based on the change of at least one of: the shape of the dynamic component, and the size of the dynamic component.

7. The method of claim 1, wherein at least one of the dynamic components comprises a polygon and the method further comprises the steps of: receiving an instruction via the interactive user interface to modify a parameter of the polygon; and modifying the parameter of the polygon based upon the instruction received via the interactive user interface.

8. The method of claim 7, wherein a change in the at least one of the multiple dynamic components comprises a region area of the polygon.

9. The method of claim 1, additionally comprising a step of receiving via the interactive user interface an instruction to modify a dominance hierarchy.

10. The method of claim 9, additionally comprising a step of receiving, via the interactive user interface, an instruction to prioritize one region area over another region area in the dominance hierarchy.

11. The method of claim 10, additionally comprising a step of setting a boundary based upon reference to a boundary allocation hierarchy.

12. The method of claim 11, additionally comprising a step of designating a type of labor associated with at least one material item to be included in construction of the building.

13. The method of claim 12, additionally comprising a step of designating a quantity of the type of labor associated with the at least one material item to be included in the construction of the building.

14. The method of claim 1, additionally comprising a step of training an AI engine via a human identifying a portion of the two-dimensional representation to comprise a particular type of architectural aspect.

15. The method of claim 14, additionally comprising a step of training the AI engine via the human identifying the portion of the two-dimensional representation to comprise a boundary.

16. The method of claim 14, additionally comprising a step of training the AI engine via reference to a boundary allocation hierarchy.

17. The method of claim 1, wherein the step of allocating the area included in a boundary to a region based upon the dominance rank comprises allocating the area included in the boundary to a region with a higher dominance rank.

18. The method of claim 1, wherein the step of allocating the area included in a boundary to a region, based upon the dominance rank, comprises allocating an equal amount of the area included in the boundary to regions with a same dominance rank.

19. The method of claim 1, additionally comprising a step of including a dominance rank in a boundary allocation hierarchy.

* * * * *